United States Patent
Asami et al.

(10) Patent No.: US 7,368,335 B2
(45) Date of Patent: May 6, 2008

(54) SEMICONDUCTOR DEVICE AND METHOD OF MANUFACTURING THE SAME

(75) Inventors: Taketomi Asami, Kanagawa (JP); Mitsuhiro Ichijo, Kanagawa (JP); Satoshi Toriumi, Kanagawa (JP); Takashi Ohtsuki, Kanagawa (JP); Toru Mitsuki, Kanagawa (JP); Kenji Kasahara, Atsugi (JP); Tamae Takano, Kanagawa (JP); Chiho Kokubo, Kanagawa (JP); Shunpei Yamazaki, Tokyo (JP); Takeshi Shichi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 172 days.

(21) Appl. No.: 11/380,147

(22) Filed: Apr. 25, 2006

(65) Prior Publication Data

US 2006/0246638 A1    Nov. 2, 2006

Related U.S. Application Data

(60) Continuation of application No. 10/792,132, filed on Mar. 4, 2004, now Pat. No. 7,034,337, which is a division of application No. 09/918,547, filed on Aug. 1, 2001, now Pat. No. 6,703,265, and a continuation-in-part of application No. 09/880,089, filed on Jun. 14, 2001, now Pat. No. 6,828,587.

(30) Foreign Application Priority Data

Aug. 2, 2000   (JP) ............... 2000-234913

(51) Int. Cl.
    *H01L 21/84* (2006.01)
(52) U.S. Cl. ..................... 438/150; 257/347

(58) Field of Classification Search .......... 257/E29.29, 257/E29.004, E21.133, E21.413, 72, 347; 438/149, 150, 166, 487
See application file for complete search history.

(56) References Cited

U.S. PATENT DOCUMENTS

| | | | |
|---|---|---|---|
| 4,987,005 A | 1/1991 | Suzuki et al. | |
| 5,162,933 A | 11/1992 | Kakuda et al. | |
| 5,304,407 A | 4/1994 | Hayashi et al. | |
| 5,437,895 A | 8/1995 | Kodama et al. | |
| 5,643,826 A | 7/1997 | Ohtani et al. | |
| 5,686,980 A | 11/1997 | Hirayama et al. | |
| 5,726,487 A * | 3/1998 | Sameshima et al. | 257/616 |
| 5,904,567 A | 5/1999 | Yamazaki | |
| 5,923,962 A | 7/1999 | Ohtani et al. | |
| 5,932,893 A | 8/1999 | Miyanaga et al. | |
| 5,943,560 A | 8/1999 | Chang et al. | |
| 5,977,560 A | 11/1999 | Banerjee et al. | |
| 6,087,679 A | 7/2000 | Yamazaki et al. | |
| 6,107,639 A | 8/2000 | Yamazaki et al. | |
| 6,107,654 A | 8/2000 | Yamazaki | |
| 6,130,118 A | 10/2000 | Yamazaki | |
| 6,180,957 B1 | 1/2001 | Miyasaka et al. | |
| 6,190,949 B1 | 2/2001 | Noguchi et al. | |
| 6,285,042 B1 | 9/2001 | Ohtani et al. | |
| 6,307,214 B1 | 10/2001 | Ohtani et al. | |
| 6,307,220 B1 | 10/2001 | Yamazaki | |
| 6,335,541 B1 | 1/2002 | Ohtani et al. | |
| 6,348,368 B1 | 2/2002 | Yamazaki et al. | |
| 6,479,333 B1 | 11/2002 | Takano et al. | |
| 6,495,886 B1 | 12/2002 | Yamazaki et al. | |
| 6,690,068 B2 | 2/2004 | Yamazaki et al. | |
| 6,787,807 B2 | 9/2004 | Yamazaki et al. | |
| 6,828,587 B2 | 12/2004 | Yamazaki et al. | |
| 2001/0014535 A1 | 8/2001 | Yamazaki | |
| 2002/0008286 A1 | 1/2002 | Yamazaki et al. | |
| 2002/0014625 A1 | 2/2002 | Asami et al. | |
| 2002/0038889 A1 | 4/2002 | Yamazaki et al. | |
| 2002/0043662 A1 | 4/2002 | Yamazaki et al. | |

FOREIGN PATENT DOCUMENTS

| | | |
|---|---|---|
| JP | 02-219234 | 8/1990 |
| JP | 07-130652 | 5/1995 |
| JP | 08-078329 | 3/1996 |
| JP | 11-204434 | 7/1999 |

| | | |
|---|---|---|
| JP | 11-284198 | 10/1999 |
| JP | 11-307783 | 11/1999 |
| TW | 251379 | 7/1995 |
| TW | 310478 | 7/1997 |

OTHER PUBLICATIONS

R. Ishihara et al.; "Microtexture Analysis of Location Controlled Large Si Grain Formed by Excimer-Laser Crystallization Method"; *Active-Matrix Liquid-Crystal Displays 1999*; TFT Technologies and Related Materials; Digest of Technical Papers; Kogakuin University, Tokyo, Japan; pp. 99-102; Jul. 14-16, 1999.

Seok-Woon Lee et al.; "Low Temperature Poly-Si Thin-Film Transistor Fabrication by Metal-Induced Lateral Crystallization"; *IEEE Electron Device Letters*, vol. 17, No. 4; pp. 160-162; Apr. 1996.

\* cited by examiner

*Primary Examiner*—David Vu
(74) *Attorney, Agent, or Firm*—Fish & Richardson P.C.

(57) ABSTRACT

The orientation ratio of a crystalline semiconductor film obtained by crystallizing an amorphous semiconductor film through heat treatment and irradiation of intense light such as laser light, ultraviolet rays, or infrared rays is enhanced, and a semiconductor device whose active region is formed from the crystalline semiconductor film and a method of manufacturing the semiconductor device are provided. In a semiconductor film containing silicon and germanium as its ingredient and having a crystal structure, the {101} plane reaches 30% or more of all the lattice planes detected by Electron backscatter diffraction. This semiconductor film is obtained by forming an amorphous semiconductor film containing silicon and germanium as its ingredient through plasma CVD in which hydride, fluoride, or chloride gas of a silicon atom is used, the repetition frequency is set to 10 kHz or less, and the duty ratio is set to 50% or less for intermittent electric discharge or pulsed electric discharge, and introducing an element for promoting crystallization of the amorphous semiconductor film to the surface thereof to crystallize the amorphous semiconductor film while utilizing the introduced element.

24 Claims, 26 Drawing Sheets

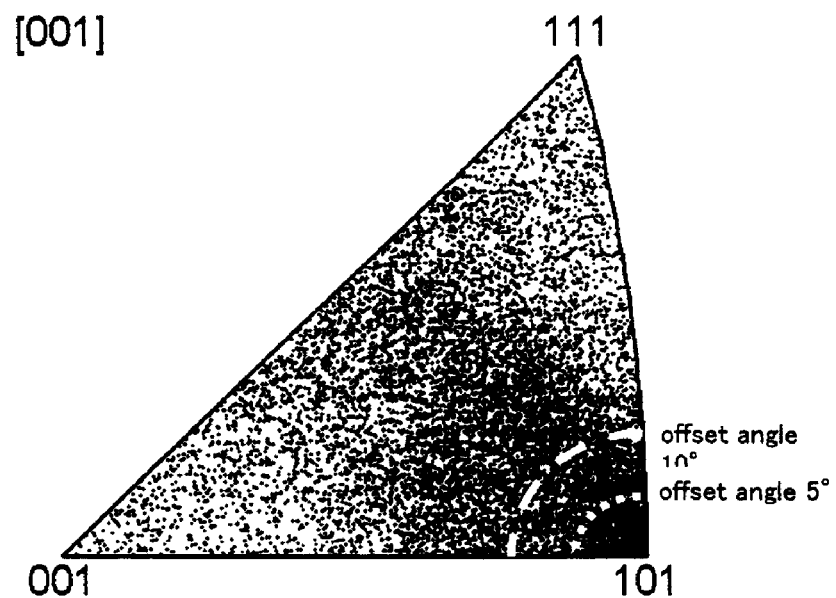
Fig. 6A plotting all of the measurement points in the mapping measurement
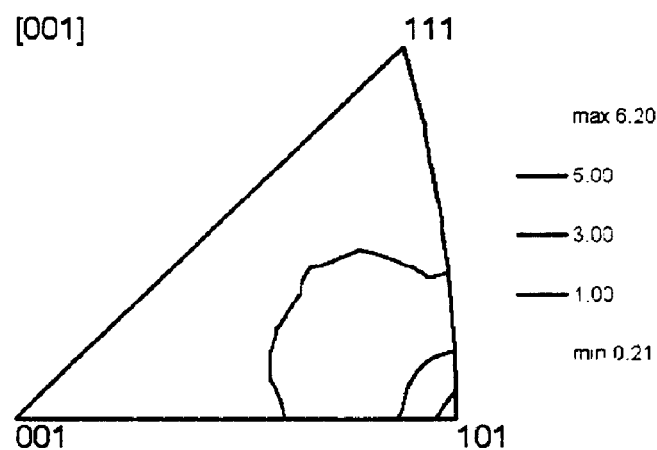
Fig. 6B example of expressing as contour an orientation distribution function to specific index.

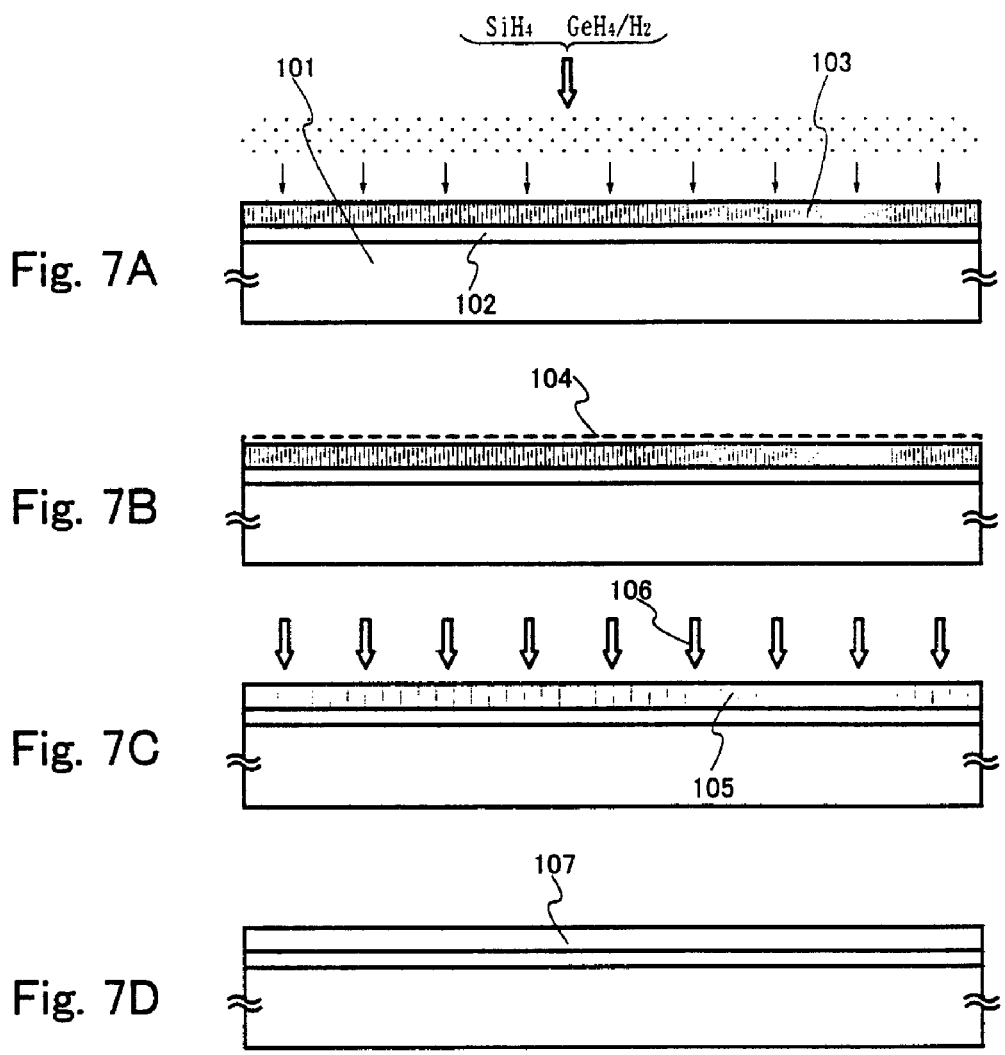

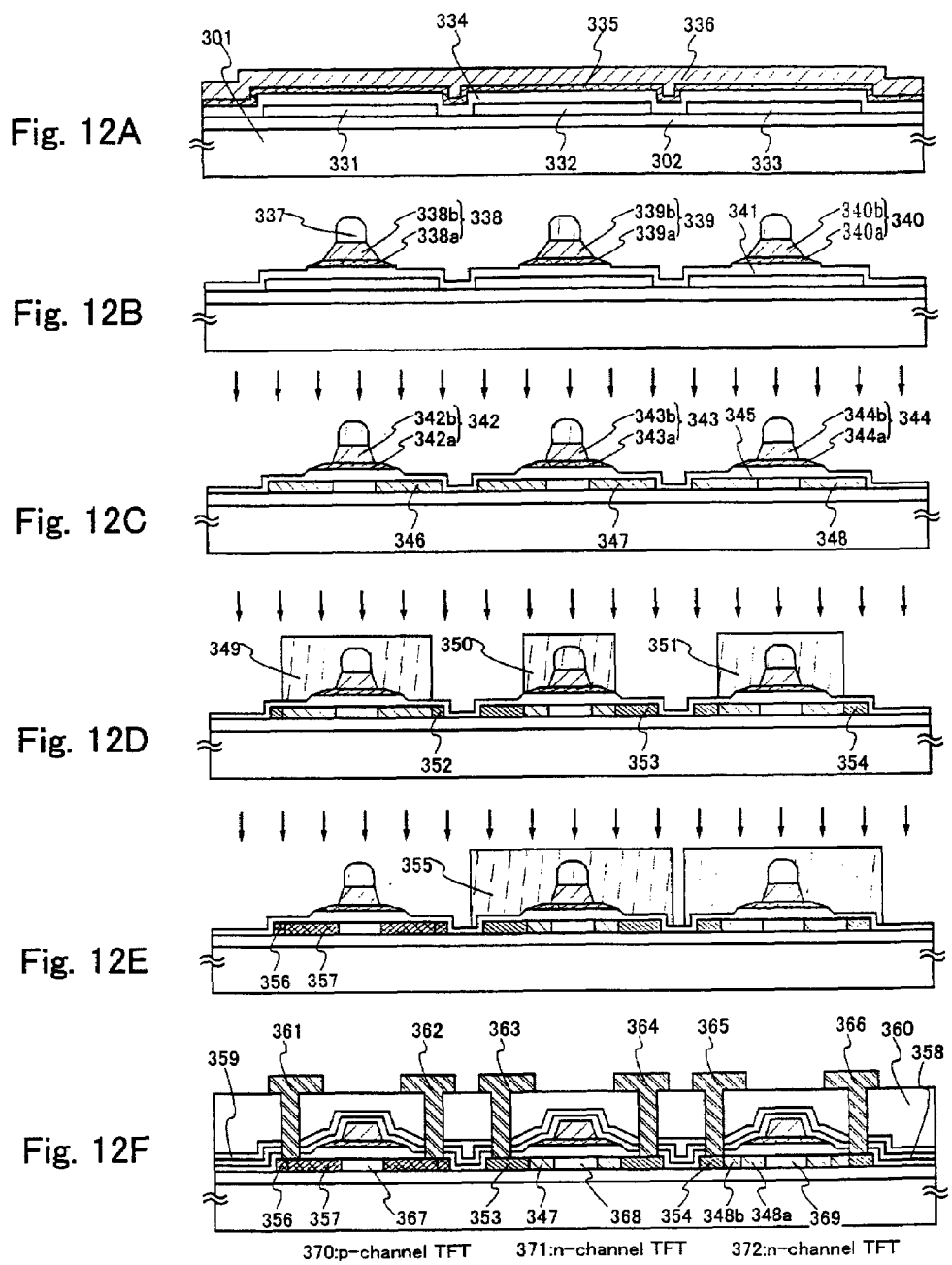

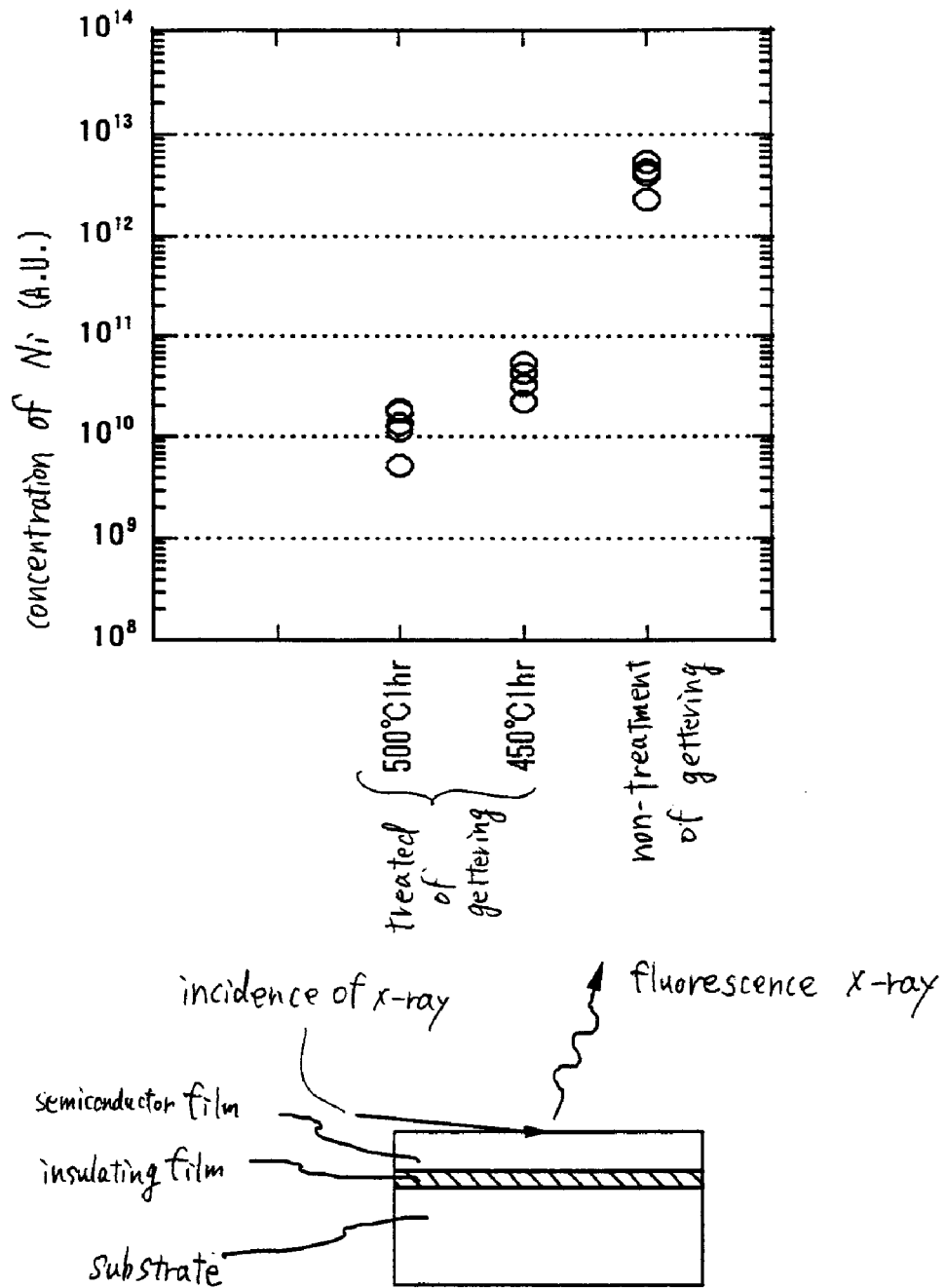

SEMICONDUCTOR DEVICE AND METHOD OF MANUFACTURING THE SAME

CROSS-REFERENCE TO RELATED APPLICATIONS

This application is continuation of U.S. application Ser. No. 10/792,132, filed on Mar. 4, 2004, now U.S. Pat. No. 7,034,337; which is a divisional application of U.S. application Ser. No. 09/918,547, filed on Aug. 1, 2001, now U.S. Pat. No. 6,703,265; which claims priority from, and is a continuation-in-part of, U.S. application Ser. No. 09/880,089, filed Jun. 14, 2001, now U.S. Pat. No. 6,828,587; and which claims the benefit of a foreign priority application filed in Japan on Aug. 2, 2000, as application Ser. No. 2000-234913. This application claims priority all of these applications, and all of these applications are incorporated by reference.

BACKGROUND OF THE INVENTION

1. Field of the Invention

The present invention relates to a semiconductor film having a polycrystal structure in which crystals mass with diverse orientations as in a polycrystalline semiconductor film. The invention also relates to a semiconductor device whose active region is formed of this semiconductor film and to a method of manufacturing the semiconductor device. In particular, the present invention is suitable for a method of manufacturing a thin film transistor formed a channel formation region in this semiconductor film. The term semiconductor device herein refers to a semiconductor device in general which utilizes semiconductor characteristics to function, and semiconductor integrated circuits, electro-optical devices, and electronic equipment mounted with the semiconductor integrated circuits or the electro-optical devices fall within this category.

2. Description of the Related Art

A technique has been developed for manufacturing a thin film transistor (hereinafter referred to as TFT) from a semiconductor film that has a polycrystal structure (the film is hereinafter referred to as crystalline semiconductor film) and is formed on a glass, quartz or other substrate. A TFT formed from a crystalline semiconductor film is applied to flat panel displays, typically, liquid crystal display devices, as measures for realizing high definition image display, and is applied to monolithic displays in which a pixel portion and an integrated circuit necessary to drive the pixel portion are formed on the same substrate, as measures for realizing it.

A known alternative to SOI (silicon on insulator technology) in forming a crystalline semiconductor film is to use vapor growth method (CVD) in which a crystalline semiconductor film is formed by direct deposition on a substrate, or to crystallize an amorphous semiconductor film by heat treatment or laser light irradiation. If the formed crystalline semiconductor film is to be applied to a TFT, the latter method is employed more often because the method provides the TFT with excellent electric characteristics.

A crystalline semiconductor film can have a polycrystal structure if it is obtained by subjecting an amorphous semiconductor film formed on a glass, quartz or other substrate to heat treatment or laser light irradiation for crystallization. Crystallization is known to progress from a crystal nuclear spontaneously generated in the interface between the amorphous semiconductor film and the substrate. While crystal grains in a polycrystal structure each educe an arbitrary crystal plane, it has been found that the proportion, which the crystallization of the {111} plane requiring the minimum interface energy is educed, is high if silicon oxide is placed under the crystalline semiconductor film.

The thickness of a semiconductor film required for TFT is about 10 to 100 nm. However, it is difficult in this thickness range to control crystal orientation in the interface between the semiconductor film and a substrate that is formed from a different material due to lattice discordance or crystal nuclei generated irregularly. Also, it has been impossible to increase the grain size of each crystal grain because of mutual interference between crystal grains.

Another method of forming a crystalline silicon film has been disclosed in which an element for promoting crystallization of silicon is introduced into an amorphous silicon film, thereby obtaining a crystalline silicon film through heat treatment at a temperature lower than in prior art. For example, Japanese Patent Application Laid-open Nos. Hei 7-130652 and Hei 8-78329 describe obtaining a crystalline silicon film by introducing nickel or other metal element into an amorphous silicon film and subjecting the film to heat treatment at 550° C. for four hours.

In this case, the element introduced at a temperature lower than the temperature at which a natural nuclear is generated forms silicide, and crystal growth starts from this silicide. For instance, when the element is nickel, nickel silicide ($NiSi_x$ ($0.4 \leq x \leq 2.5$)) is formed. While nickel silicide has no specific orientation, it advances crystal growth in an amorphous silicon film almost only in the direction parallel to the substrate if the thickness of the film is 10 to 100 nm. In this case, the interface energy of the interface between $NiSi_x$ and the {111} plane of the crystalline silicon is the smallest, and hence the plane parallel to the surface of the crystalline silicon film is the {110} plane to orient crystals mainly in the {110} plane orientation. However, when the crystal growth direction is parallel to the substrate surface and a crystal grows into a pillar, the crystal may not always be oriented in the {110} plane orientation because there is a degree of freedom in the rotation direction as axis of the pillar-like crystal. Accordingly, other lattice planes are deposited.

When the orientation ratio is low, continuity of lattices cannot be maintained in a crystal grain boundary where crystals of different orientations meet one another, resulting in formation of many dangling bonds. The dangling bonds formed in the crystal grain boundary acts as recombination center or trap center, to thereby lower the carrier (electrons or holes) transportation characteristic. As a result, carriers are lost in recombination or trapped by defects. If a crystalline semiconductor film as such is used to form a TFT, the TFT cannot have high electric field effect mobility.

Also, controlling positions of crystal grains as desired is nearly impossible and crystal grain boundaries are placed irregularly, which does not allow a TFT to form its channel formation region solely from crystal grains of a specific crystal orientation. This lowers the continuity of crystal lattices and forms defects in crystal grain boundaries, thereby causing fluctuations in TFT characteristics and presenting various adverse influences. For instance, the field effect mobility is degraded to make the TFT incapable of operating at high speed. In addition, a fluctuation in threshold voltage is an obstruction to low voltage driving, leading to an increase in power consumption.

SUMMARY OF THE INVENTION

The present invention has been made to present solutions to those problems, and an object of the present invention is therefore to raise the orientation ratio of a crystalline semiconductor film obtained by crystallizing an amorphous semiconductor film through heat treatment and irradiation of intense light such as laser light, ultraviolet rays, or infrared rays and to provide a semiconductor device whose active region is formed from the crystalline semiconductor film and a method of manufacturing the semiconductor device.

In order to solve the above problems, the present invention uses a semiconductor film containing silicon and germanium as its ingredient and having a crystal structure, the semiconductor film having the {101} plane that reaches 30% or more of all the lattice planes detected by reflection electron diffraction pattern method. This semiconductor film is obtained by forming an amorphous semiconductor film containing silicon and germanium as its ingredient through plasma CVD in which hydride, fluoride, or chloride gas of a silicon element is used, the repetition frequency is set to 10 kHz or less, and the duty ratio is set to 50% or less for intermittent electric discharge or pulsed electric discharge, and by introducing an element for promoting crystallization of this amorphous semiconductor film to the surface thereof to crystallize the amorphous semiconductor film through heat treatment, or through heat treatment and irradiation of intense light such as laser light, ultraviolet rays, or infrared rays, while utilizing the introduced element. The semiconductor film having a crystal structure can be used for an active layer such as a channel formation region.

The thus formed semiconductor film contained silicon and germanium and having a crystal structure contains Group 14 (new international notation) elements in the periodic table other than silicon in a concentration of $1\times10^{18}$ atoms/cm$^3$ or below. The semiconductor film contains less than $5\times10^{18}$ nitrogen atoms per cm$^3$, less than $5\times10^{18}$ carbon atoms per cm$^3$, and less than $1\times10^{19}$ oxygen atoms per cm$^3$.

The element for promoting crystallization is one or more elements selected from the group consisting of Fe, Co, Ni, Ru, Rh, Pd, Os, Ir, Pt, Cu, and Au. The thickness of the amorphous semiconductor film is set to 10 to 100 nm. An amorphous silicon film is doped with the metal element given in the above and subjected to heat treatment to form a compound of silicon and the metal element (silicide). Formation of the compound spreads to advance crystallization. Germanium contained in the amorphous silicon film does not react with this compound and generates local distortion by being present around the compound. This distortion acts to increase the critical radius of nuclear generation and to reduce the nuclear generation density. The distortion also has an effect of limiting orientation of crystals.

The concentration of germanium needed to exhibit those effects has been found to be 0.1 atomic percent or more and 10 atomic percent or less, preferably 1 atomic percent or more and 5 atomic percent or less, with respect to silicon, as a result of experiments. If the germanium concentration exceeds this upper limit, silicon and germanium reacts and form an alloy to generate a large number of natural nuclei (spontaneously generated nuclei other than the compound of silicon and the metal element used for the doping), and a polycrystalline semiconductor film obtained cannot have a high orientation ratio. On the other hand, if the germanium concentration is lower than the lower limit, the distortion generated is not enough to raise the orientation ratio.

The amorphous silicon film doped with germanium is formed by plasma CVD using intermittent electric discharge or pulsed electric discharge. The intermittent electric discharge or pulsed electric discharge is obtained by modulating high frequency power with an oscillation frequency of 1 to 120 MHz, preferably 13.56 to 60 MHz, into power with a repetition frequency of 10 Hz to 10 kHz and by supplying the modulated power to a cathode. When the duty ratio is defined as the ratio of time during which high frequency power application lasts to one cycle of the repetition frequency, the duty ratio is set to 1 to 50%.

The intermittent electric discharge or pulsed electric discharge as above allows selection of radical species (meaning here atoms or molecules that are electrically neutral and chemically active) in the deposition process of the amorphous semiconductor film, so that a film can be formed from a radical species having a relatively long life period. For example, various radical species and ion species are generated when dissolving SiH$_4$ in an electric discharge space. Radical species repeat generation and extinguishment reactions but electric discharge that is continued steadily keeps the existence proportions of radical species fixed. On the other hand, if there is a period where electric discharge is stopped as in intermittent electric discharge or pulsed electric discharge, only radical species that has longer life period is supplied due to the difference in life period between the radical species and ion species to the film deposition surface and is used to form the film.

A long-living radical is chosen in order to inactivate the film growth surface and is suitable for dispersing and including germanium throughout the amorphous silicon film. GeH$_4$, which is a germanium source, is smaller in dissolution energy than SiH$_4$, and hence generates atomic-state germanium when dissolved with the same supply power as SiH$_4$, forms germanium clusters through vapor reaction or surface reaction. Dispersed germanium is preferred according to the crystal growth model described above, which leads to the conclusion that intermittent electric discharge in which no cluster is generated is preferable.

The amorphous semiconductor film loses its volume when crystallized due to rearrangement of atoms. As a result, the polycrystalline semiconductor film on the substrate contains tensile stress. However, the volume shrinkage accompanied crystallization can be limited and the internal stress generated can be reduced by making the amorphous semiconductor film contain germanium with a large atom radius in 0.1 atomic percent or more and 10 atomic percent or less, preferably 1 atomic percent or more and 5 atomic percent or less, with respect to silicon. At this point, germanium is contained preferably in a dispersed state in order to obtain a uniform effect throughout the film.

BRIEF DESCRIPTION OF THE DRAWINGS

In the accompanying drawings;

FIGS. 6A and 6B are schematic diagrams showing examples of reverse pole diagrams obtained by an EBSP method;

FIGS. 7A to 7D are diagrams illustrating a method of forming a crystalline semiconductor film according to the present invention;

FIGS. 12A to 12F are diagrams illustrating a process of manufacturing a TFT with a CMOS structure from a crystalline semiconductor film according to the present invention;

FIG. 26A is a graph showing the concentration of a metal element measured by TXRF before and after gettering treatment.

FIG. 26B shows a method of measurement by TXFR.

DETAILED DESCRIPTION OF THE PREFERRED EMBODIMENTS

Embodiment Mode

Figure 1:
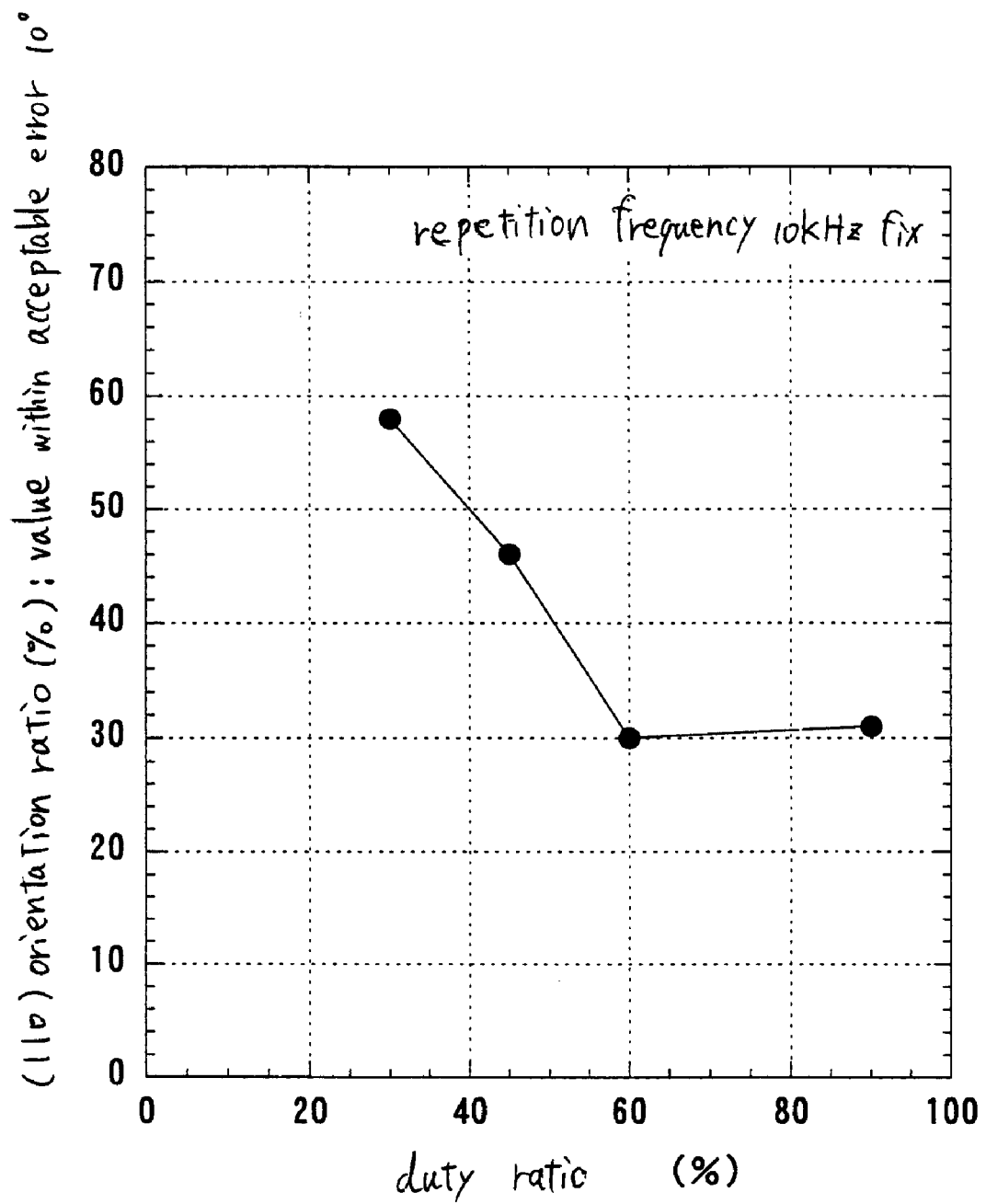
FIG. 1 is a graph containing data for orientation ratio of a crystalline semiconductor film, showing duty ratio dependency in intermittent electric discharge as a film formation condition of an early deposition film.

The present invention is characterized in that a semiconductor film used for a channel formation region of a TFT is a crystalline semiconductor film having high {110} lattice plane orientation ratio and containing silicon and germanium as its ingredient. A typical embodiment mode of obtaining this crystalline semiconductor film includes: forming an amorphous semiconductor film containing silicon and germanium as its ingredient through plasma CVD by intermittent electric discharge or pulsed electric discharge in which hydride, fluoride, or chloride gas of a silicon atom and a germanium atom is used; introducing an element for promoting crystallization of the amorphous semiconductor film to the surface thereof; and crystallizing the amorphous semiconductor film through heat treatment, or through heat treatment and irradiation of intense light such as laser light, ultraviolet rays, or infrared rays, while utilizing the introduced element to form the crystalline semiconductor film.

A substrate suitable for forming this crystalline semiconductor film is a non-alkaline glass substrate such as an aluminoborosilicate glass substrate and a barium borosilicate glass substrate. Typically, a Corning # 7059 glass substrate or a Corning # 1737 glass substrate (product of Corning Incorporated) is used. A quartz substrate or a sapphire substrate may also be used. Alternatively, a silicon, germanium, gallium, arsenic or other semiconductor substrate with an insulating film formed on its surface may be used as the substrate.

If the glass substrate is chosen, a blocking layer is formed between the amorphous semiconductor film and the glass substrate from silicon nitride, silicon oxide, silicon oxynitride or the like. The blocking layer prevents an impurity element such as an alkaline metal element contained in the glass substrate from diffusing into the semiconductor film. For example, a silicon nitride film is formed by plasma CVD using as reaction gas $SiH_4$, $NH_3$, and $N_2$. If a silicon oxynitride film is to be formed instead. $SiH_4$, $N_2O$ and $NH_3$ are used as reaction gas. The blocking layer is formed to have a thickness of 20 to 200 nm.

The amorphous semiconductor film is formed on the thus prepared substrate by plasma CVD using intermittent electric discharge or pulsed electric discharge. The intermittent electric discharge or pulsed electric discharge is obtained by modulating high frequency power with an oscillation frequency of 1 to 120 MHz, preferably 13.56 to 60 MHz, into power with a repetition frequency of 10 Hz to 10 kHz and by supplying the modulated power to a cathode. When the duty ratio is defined as the ratio of time during which high frequency power application lasts in one cycle of the repetition frequency, the duty ratio is desirably set to 1 to 50%.

One of the reasons for employing intermittent electric discharge or pulsed electric discharge as above is that it allows selection of radical species (meaning here atoms or molecules that are electrically neutral and chemically active) in the deposition process of the amorphous semiconductor film, so that a film can be formed from a radical species having a relatively long life period. For example, various radical species and ion species are generated when dissolving SiH4 in an electric discharge space. When electric discharge is constituted steadily, the existence proportions of radical species keep fixed. On the other hand, if there is a period where electric discharge is turned off as in intermittent electric discharge or pulsed electric discharge, only radical species that has longer life period is supplied due to the difference in life period between the radical species and ion species to the film deposition surface and is used to form the film.

Figure 18:
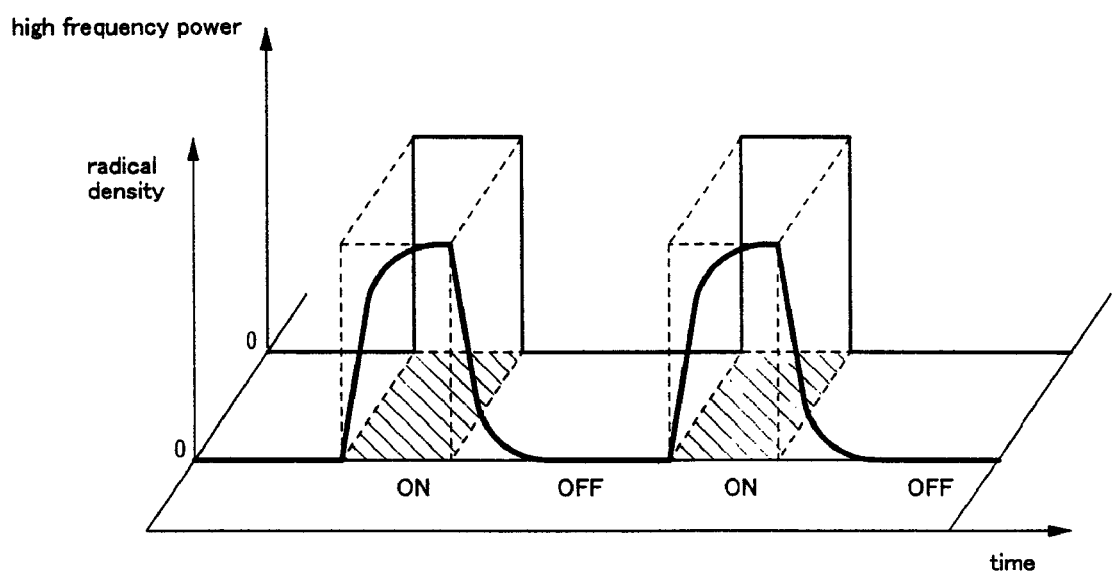
FIG. 18 is a diagram of a model for explaining application of high frequency power and a generation process of radicals.

FIG. 18 is a diagram schematically illustrating turning ON of high frequency power and changes with time in radical concentration. The intermittent electric discharge or pulsed electric discharge according to the present invention includes ON time in which high frequency power is applied to a cathode and OFF time in which the supply of high frequency power is shut off. For example, in the case where high frequency power having an oscillation frequency of 27 MHz is supplied at a repetition frequency of 10 kHz and a duty ratio of 10%, ON time is 1 μsec whereas OFF time is 9 μsec. Radical species and ion species generated by electric discharge are different from one another in generation speed and extinguishment speed (life period). If some radical species is picked out, the concentration of this radical species changes transiently as shown in FIG. 18. To elaborate, the concentration of the radical species increases as high frequency power is supplied until it reaches some saturation state. The radical species decreases and is extinguished when the supply of high frequency power is cut and its parent gas molecule is no longer dissociated. The extinguishment takes a certain period of time. Usually, the life period is defined as the time a radical species takes to decrease to 1/e.

For example, SiH radical and $SiH_2$ radical have life periods of $1.72 \times 10^{-4}$ seconds and $2.47 \times 10^{-6}$ seconds, respectively (these values are of when the radicals are in $SiH_4$ plasma at 50 mTorr). $SiH_3$ is considered by contrast as long-living from the fact that it repeats the '$SiH_3$+$SiH_4 \rightarrow SiH_3 + SiH_4$' reaction. It is said that $SiH_3$ is appropriate for forming an amorphous silicon film of excellent quality. $GeH_4$ is smaller in dissolution energy than $SiH_4$, and hence generates a large number of Ge radicals (or atomic-state Ge) when dissolved with the same high frequency power as $SiH_4$. The Ge radicals are presumably active and short-living.

Accordingly, by optimizing the repetition frequency and the duty ratio, a given radical species can selectively be taken out to be used for film formation preemptively. In practice, a radical species having a long life period is taken out. A long-living radical species is low in chemical activity relatively, and hence it makes easy to control surface reaction in forming the film.

Selection of radical species is reduced as the duty ratio becomes larger, making the film formation mechanism identical with the film formation mechanism in continuous electric discharge with no modulation. According to the experiments conducted by the present inventors, the effects provided by the intermittent electric discharge are decreased when the duty ratio exceeds 50%.

In any case, the gas used in the present invention has to be refined to high purity in order to reduce the concentration of impurity elements such as oxygen, nitrogen, and carbon mixed in the amorphous semiconductor film during deposition. The amorphous semiconductor film formed by deposition has a thickness of 10 to 100 nm.

The amorphous semiconductor film used in the present invention is formed from a material containing silicon and germanium as its ingredients, and contains Group 14 elements other than silicon and germanium in a concentration of less than $5 \times 10^{18}$ atoms/cm$^3$. In forming this amorphous semiconductor film, typical reaction gas. Namely, a mixture of $SiH_4$ and $GeH_4$, or $SiH_4$ and $GeH_4$ diluted by $H_2$ is used. $SiH_4$ may be replaced by $Si_2H_6$ or $SiF_4$ whereas $GeH_4$ may be replaced by $GeF_4$. Nitrogen, carbon, and oxygen, and their concentrations are less than $5 \times 10^{18}$ atoms/cm$^3$, less than $5 \times 10^{18}$ atoms/cm$^3$, and less than $1 \times 10^{19}$ atoms/cm$^3$, respectively, as the different kind elements contained in the amorphous semiconductor film. These impurities deposit mainly in grain boundaries of crystal grains during crystallization process and raise the potential barrier of the grain boundaries, thereby causing inconveniences such as impaired carrier mobility.

Further, in the present invention the concentration of the different kind elements contained in the amorphous semiconductor film is herein detected by secondary ion mass spectroscopy (SIMS), and indicates the lowest concentration value in the film.

An element for promoting crystallization of an amorphous semiconductor film is introduced to the thus formed amorphous semiconductor film. Examples of the element include one or more elements selected from the group consisting of iron (Fe), nickel (Ni), cobalt (Co), ruthenium (Ru), rhodium (Rh), palladium (Pd), osmium (Os), iridium (Ir), platinum (Pt), copper (Cu), and gold (Au). The elements listed above can be used as the element for promoting crystallization of the amorphous semiconductor film in every mode of the present invention which is described in this specification. The above elements all provide the same effect at the same level, though nickel is the element that is typically used.

The elements are introduced to the entire surface of the amorphous semiconductor film, or to the surface of the amorphous semiconductor film of slits or dots state suitably placed. In the former case, the surface of the amorphous semiconductor film to which the elements are to be introduced may be the substrate side surface or the surface opposite to the substrate. In the latter case, an insulating film is preferably formed on the amorphous semiconductor film so that the elements are introduced to the amorphous semiconductor film through openings formed in the insulating film. The size of the openings is not particularly limited, but a recommended width is 10 to 40 μm. The longitudinal length of the openings may be set to an arbitrary value within a range of several tens μm to several tens cm.

The method of introducing the elements is not particularly limited as long as the method such as elements are held to the surface of the amorphous semiconductor film or the elements are mixed into the amorphous semiconductor film. Examples of the usable introduction method include sputtering, evaporation, plasma treatment (including plasma CVD), adsorption, and application of a metallic salt solution. In plasma treatment, the elements sputtered from the cathode in a glow electric discharge atmosphere by inert gas are used. Application of a metallic salt solution is easy, and advantageous as regard the simpleness of adjusting the elements concentration.

Various kinds of salts can be used for the metallic salt. Examples of the usable solvent include water; alcohols, aldehyde esters, ethers or other organic solvents; and a mixture of water and these organic solvents. The metallic salt may not always be dissolved completely in the solution. A solution in which a part of or the entirety of metallic salt is suspended may be used. Whatever method is employed, the elements have to be introduced to the surface of the amorphous semiconductor film or into the amorphous semiconductor film while being dispersed.

After the elements are introduced by one of the above methods, the amorphous semiconductor film is crystallized utilizing the introduced elements. The crystallization is achieved by heat treatment or by irradiating the film with intense light such as laser light, ultraviolet rays, and infrared rays (hereinafter collectively referred to as laser treatment). Heat treatment alone can provide a crystalline semiconductor film in which the major orientation is the {101} plane orientation. However, heat treatment is preferably followed by irradiation of intense light such as laser light. The laser treatment subsequent to the heat treatment can repair crystal defects left in crystal grains, and hence is an effective measure to improve the quality of crystals formed.

The temperature in the heat treatment can range from 450 to 1000° C. One probable upper limit for the temperature is set by the heat resistance of the substrate used. For example, a quartz substrate can withstand heat treatment at 1000° C. On the other hand, in the case of a glass substrate, one probable upper limit for the temperature can be set based on the distortion point of the glass substrate so as to be lower than the same. For example, when the glass substrate has a distortion point of 667° C., an appropriate upper temperature limit will be about 660° C., preferably 600° C., or less. The time required for the heat treatment slightly varies depending upon the heating temperature and conditions for the subsequent treatment (e.g., whether or not laser light irradiation treatment is carried out). Preferably, the heat treatment is conducted at 550 to 600° C. for four to twenty-four hours. If the heat treatment is followed by laser treatment, the heat treatment is conducted at 500 to 550° C. for four to eight hours. The above heat treatment may be conducted in air or a hydrogen atmosphere, preferably, a nitrogen atmosphere or an inert gas atmosphere.

The laser treatment uses as a light source an excimer laser having a wavelength of 400 nm or less, or the second harmonic (wavelength: 532 nm) to the fourth harmonic (wavelength: 266 nm) of a YAG laser or of a $YVO_4$ laser. These laser lights are collected by an optical system into linear beam or spot light. The energy density of the laser light upon irradiation is set to 100 to 300 mJ/cm$^2$. The collected laser beam such as the above is run over a given region of the substrate to process the region. Instead of the laser, a halogen lamp, a xenon lamp, a mercury lamp, a metal halide lamp, etc. may be used as the light source.

Figure 19:
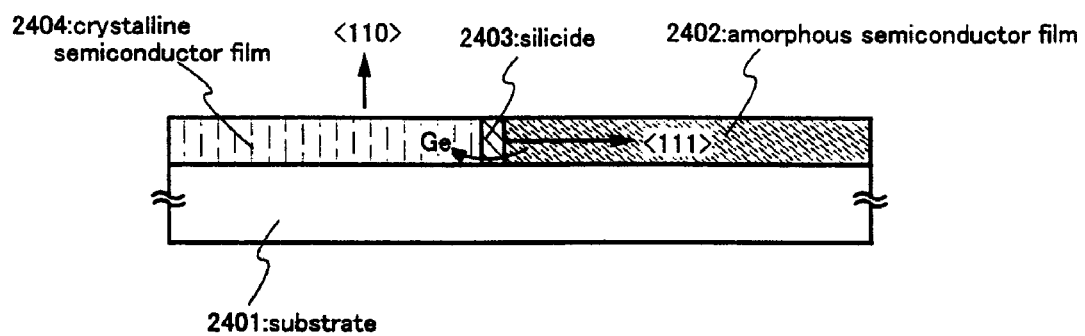
FIG. 19 is a diagram illustrating a crystallization model in which $NiSi_x$ serves as a nuclear.

The model capable of obtaining, through the above steps, the crystalline semiconductor film of the present invention in which the ratio of the {101} plane orientation is high can be inferred roughly as follows. The inference will be described with reference to FIG. 19.

An element for promoting crystallization of silicon is introduced into an amorphous semiconductor film 2402 formed on a substrate 2401, and quickly diffuses into the amorphous semiconductor film 2402 during dehydrogenation treatment. Then the element and silicon react to each other to form a silicide 2403. The silicide serves as a crystal nuclear to start crystal growth later. For instance, nickel used as a typical element forms $NiSi_x$. Since solid germanium is hardly dissolve into $NiSi_x$, $NiSi_x$ in the amorphous semiconductor film 2402 moves while pushing germanium aside.

$NiSi_x$ does not have particular orientation. However, when the amorphous semiconductor film has a thickness of 10 to 100 nm, $NiSi^x$ can grow almost only in the direction parallel to the substrate surface. In this case, the interface energy of the interface between $NiSi_x$ and the {111} plane of the crystalline silicon is the smallest, and hence the plane parallel to the surface of the crystalline silicon film is the {110} plane to orient crystals mainly in the {110} plane orientation. However, when the crystal growth direction is parallel to the substrate surface and a crystal grows into a pillar, the crystal may not always be oriented in the {110} plane orientation because there is a degree of freedom in the rotation direction as axis of the pillar-like crystal. Accordingly, other lattice planes are deposited.

From the viewpoint of $NiSi_x$, germanium having a large atom radius is present only in portions of amorphous semiconductor film which surround $NiSi_x$, and it is expected that a great distortion (tensile stress) is generated. Because of this distortion energy, the critical radius of nuclear generation is increased. Furthermore, the distortion (tensile stress) presumably has an effect of limiting crystal orientation of $NiSi_x$ nuclei and enhancing the orientation ratio of a specific crystal plane ({101} plane, to be exact).

The structure of $NiSi_x$ is of fluorite, where a nickel atom is arranged between silicon lattices having the diamond structure. When the nickel atom is removed from $NiSi_x$, the silicon crystal structure is left. From the results of numerous experiments, it has been found that the nickel atom moves toward the amorphous silicon side. Supposedly, this is because the solid solution rate is higher in the amorphous silicon than in the crystalline silicon. Accordingly, a model is proposed in which formation of a crystalline silicon film 2404 seems to advance as nickel moves in the amorphous silicon.

In order to enhance the ratio of the {101} plane orientation in the crystalline semiconductor film, an amorphous semiconductor film composed of silicon and germanium is doped with an element for promoting crystallization of silicon and crystallized by heat treatment and laser treatment in the present invention.

Figure 20A:
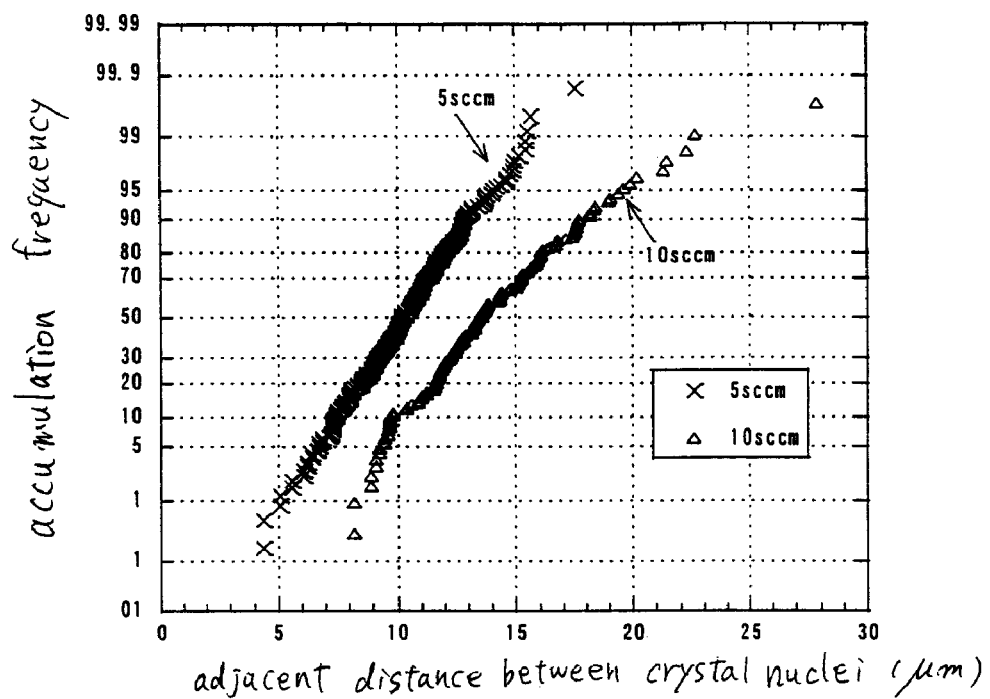
FIGS. 20A and 20B are cumulative frequency graphs showing the distance between adjacent crystal nuclei.
Figure 20B:
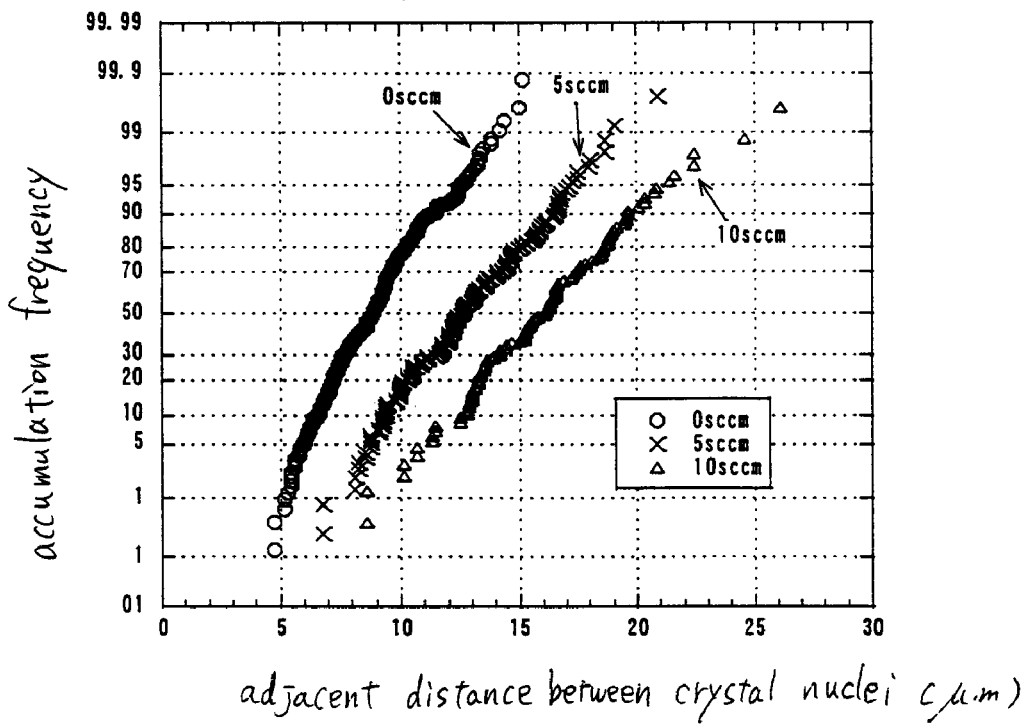

The present inventors have found that the crystal nuclear generation density is lowered when an amorphous semiconductor film, specifically, an amorphous silicon film, contains 0.1 to 10 atomic percent of germanium. FIGS. 20A and 20B are results of studying the $GeH_4$ dose dependency in relation to the distance between adjacent crystal nuclei. The axis of ordinate shows the cumulative frequency. As film formation conditions, the sum flow rate of $GeH_4$ diluted by $SiH_4$ and hydrogen to 10% is set to a constant value, 100 SCCM.

Figure 21:
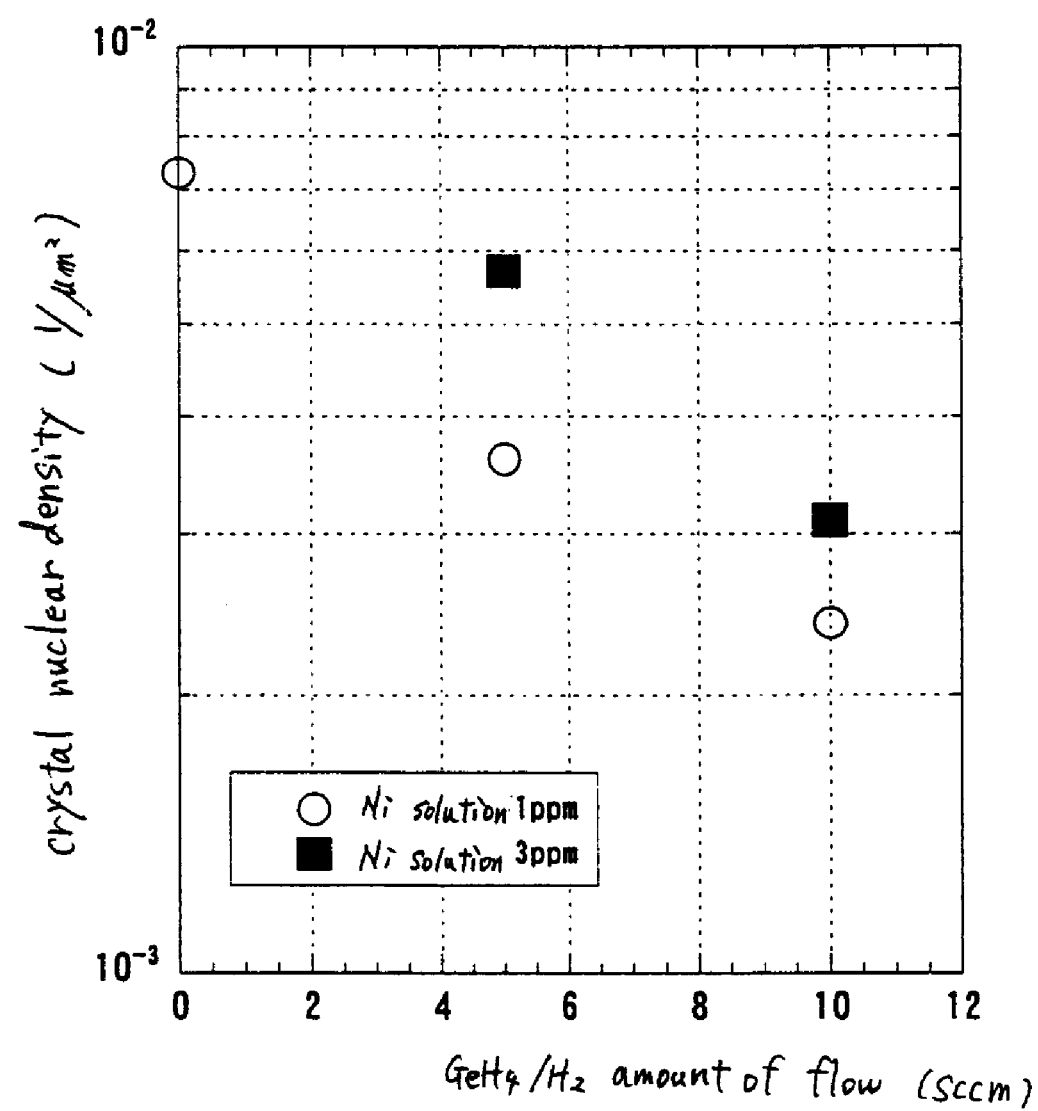
FIG. 21 is a graph showing the relation between the flow rate of $GeH_4$ and crystal nuclear generation density.

FIG. 20A shows results when an aqueous solution containing 3 ppm of nickel acetate is used as the element for promoting crystallization of silicon, whereas FIG. 20B shows results when the aqueous solution contains 1 ppm of nickel acetate. An increase in $GeH_4$ dose means an accompanying increase in concentration of germanium contained in the amorphous silicon film as the $GeH_4$ dose increase. The results in FIGS. 20A and 20B both show that the distance between adjacent crystal nuclei is longer when the $GeH_4$ dose is larger. FIG. 21 shows crystal nuclear density in relation to $GeH_4$ dose based on the results in FIGS. 20A and 20B. It can be read in FIG. 21 that the crystal nuclear density decreases as the $GeH_4$ dose increases.

From the standpoint of nuclear generation theory, an energy change $\Delta G$ when a nuclear having a volume V appears in the parent phase is given by the following equation.

$$\Delta G = \Delta Gv \times V + E \times V + \gamma s \times S \qquad \text{Equation 1}$$

wherein, $\Delta Gv$ represents a free energy change (negative) per unit volume, the first term in the right side member represents driving force of nuclear generation. E represents a distortion energy per unit volume, $\gamma s$ represents an interface energy per unit volume (S is a surface area of a nuclear deposited), and the second and third terms represent forces that work against deposition of nuclei. Because of these two terms, a nuclear having a critical radius of $r_0$ or less is unstable in terms of energy ($\Delta G$ increases together with r) and is eventually extinguished if generated at all. In other words, the equation shows that only nuclei having a critical radius of larger than $r_0$ are stable. This confirms that the presence of germanium in an amorphous silicon film works to increase the critical radius in nuclear generation in the above speculation.

In forming a crystalline semiconductor film, $GeH_4$ diluted by $SiH_4$ and hydrogen to 10% is used for the reaction gas. In order to reduce the concentration of impurities such as oxygen, nitrogen, and carbon included in the amorphous semiconductor film to be formed, $SiH_4$ of 99.9999% or higher purity and highly pure $GeH_4$ containing 1 ppm or less of nitrogen, 1 ppm or less of hydrocarbon compound, and 2 ppm or less of $CO_2$ are used for the reaction gas. High frequency power supply a peak at 0.35 W/cm$^2$ (27 MHz) and is modulated into pulsed electric discharge with a repetition frequency of 1 to 30 kHz and a duty ratio of 10 to 90% to be supplied to a cathode of a parallel flat type plasma CVD apparatus. Other conditions include setting the reaction pressure to 33.25 Pa, the substrate temperature to 200 to 400° C., and the distance between electrodes to 35 mm.

Figure 17A:
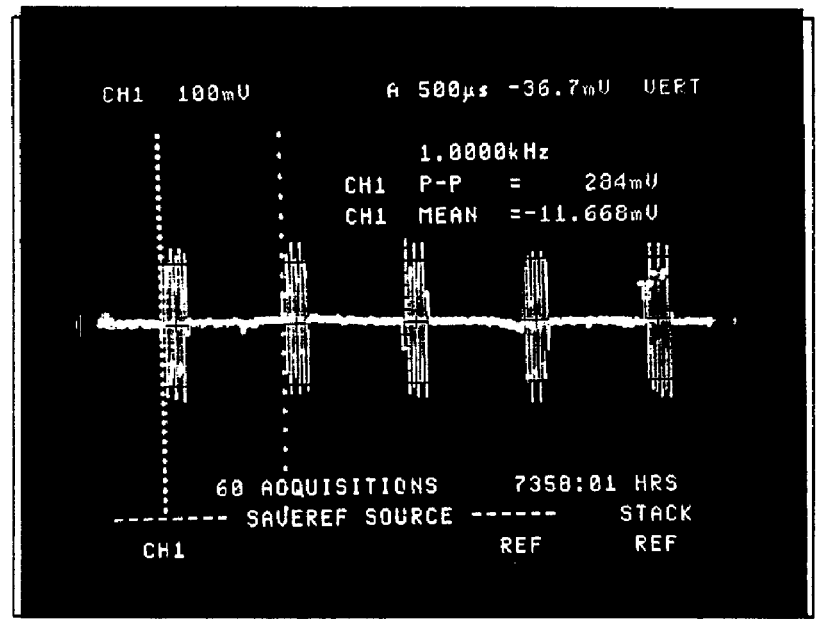
FIGS. 17A and 17B are pictures taken during oscilloscope observation of the waveform of high frequency power applied to a cathode in intermittent electric discharge plasma CVD.
Figure 17B:
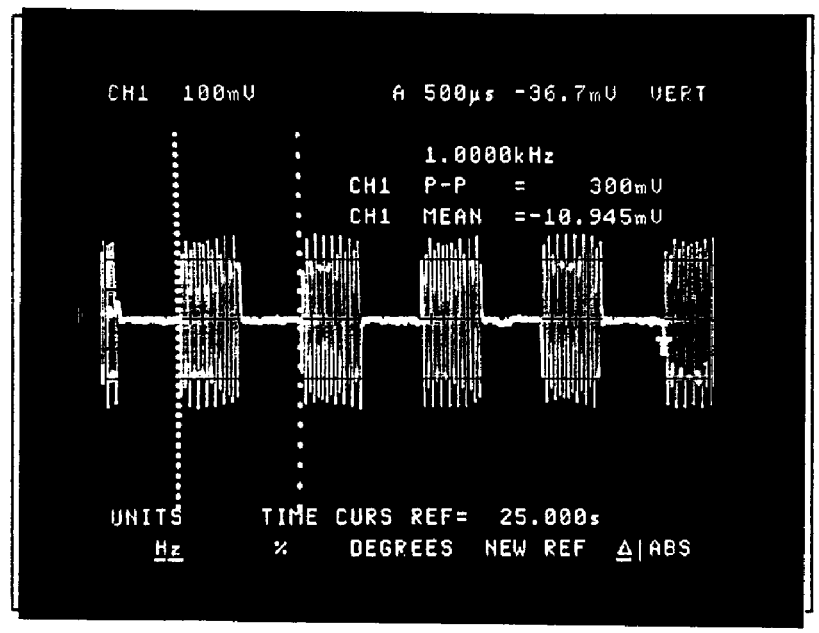

FIGS. 17A and 17B are pictures taken during oscilloscope observation of the waveform of 27 MHz high frequency power applied to a cathode of a plasma CVD apparatus. FIG. 17A shows the case in which the repetition frequency is 1 kHz and the duty ratio is 20% whereas FIG. 17B shows the case in which the repetition frequency is 1 kHz and the duty ratio is 50%. As shown in the pictures, the amorphous semiconductor film according to the present invention is formed while alternating ON time in which high frequency power is applied with OFF time in which high frequency power is not applied. The electric discharge obtained by such mode of power supply is called intermittent electric discharge or pulsed electric discharge for conveniences' sake in this specification.

Figure 4:
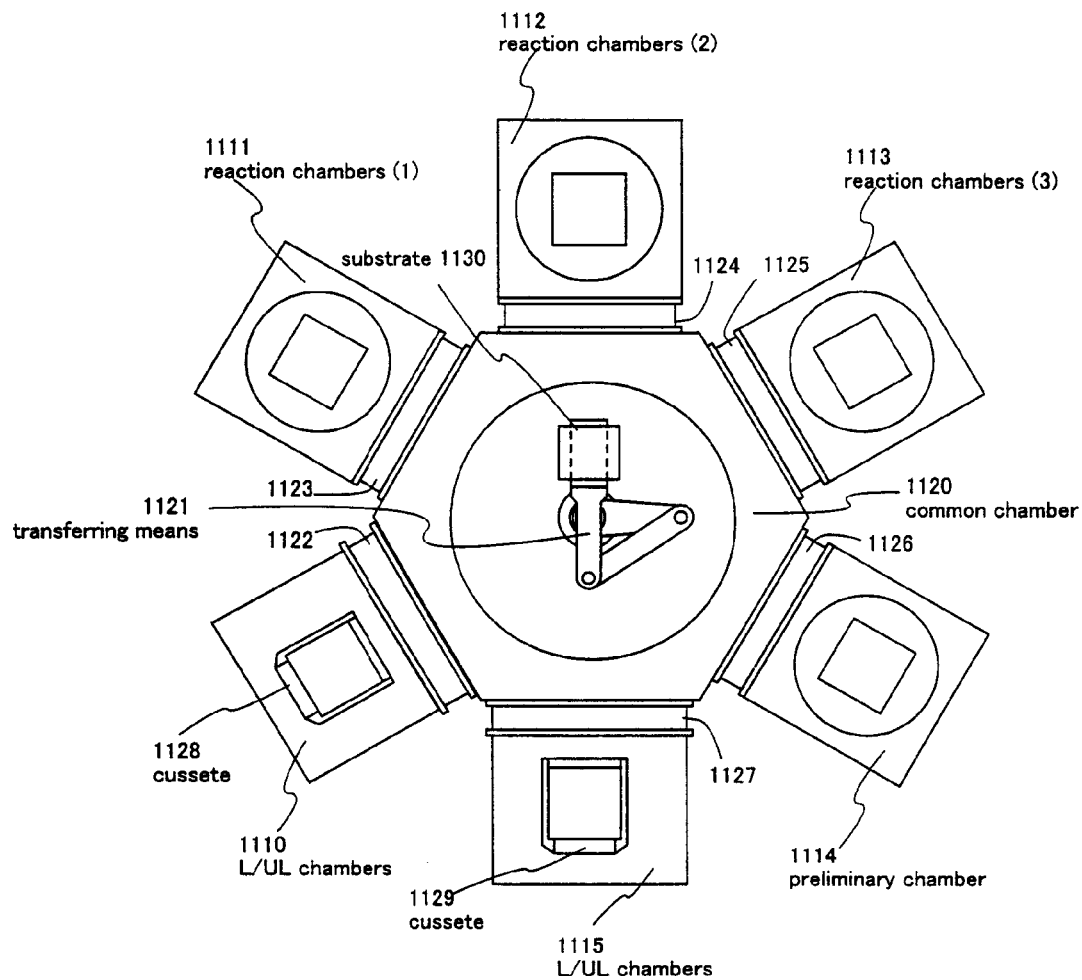
FIG. 4 is a diagram showing the structure of a plasma CVD apparatus used in the present invention.

FIG. 4 shows an example of a plasma CVD apparatus. A common chamber 1120 is connected to loading• unloading (L/UL) chambers 1110 and 1115, reaction chambers (1) to (3) 1111 to 1113, and a preliminary chamber 1114 via gate valves 1122 to 1127, respectively. Substrates are mounted to cassettes 1128 and 1129 of the loading• unloading (L/UL) chambers 1110 and 1115 and transported to the reaction chambers or to the preliminary chamber by transferring means 1121 of the common chamber 1120. The preliminary chamber 1114 is mainly for preliminary heating of a substrate. The reaction chamber (1) is for forming an insulating film such as a silicon nitride film and a silicon oxide film. The reaction chamber (2) is for forming an amorphous semiconductor film. The reaction chamber (3) is for plasma treatment by which the film is doped with an element for promoting crystallization of silicon. The chambers are thus separated to work their respective works. In the plasma treatment, the element is sputtered from a cathode comprising the element for promoting crystallization. e.g., nickel by glow electric discharge of inert gas to adhere to the amorphous semiconductor film. A plasma CVD apparatus structured as above can successively process formation of a blocking layer, which is to be formed contacting closely to a substrate, formation of an amorphous semiconductor film, and doping of an element for promoting crystallization of the amorphous semiconductor film, without exposing the device to the air.

Figure 5:
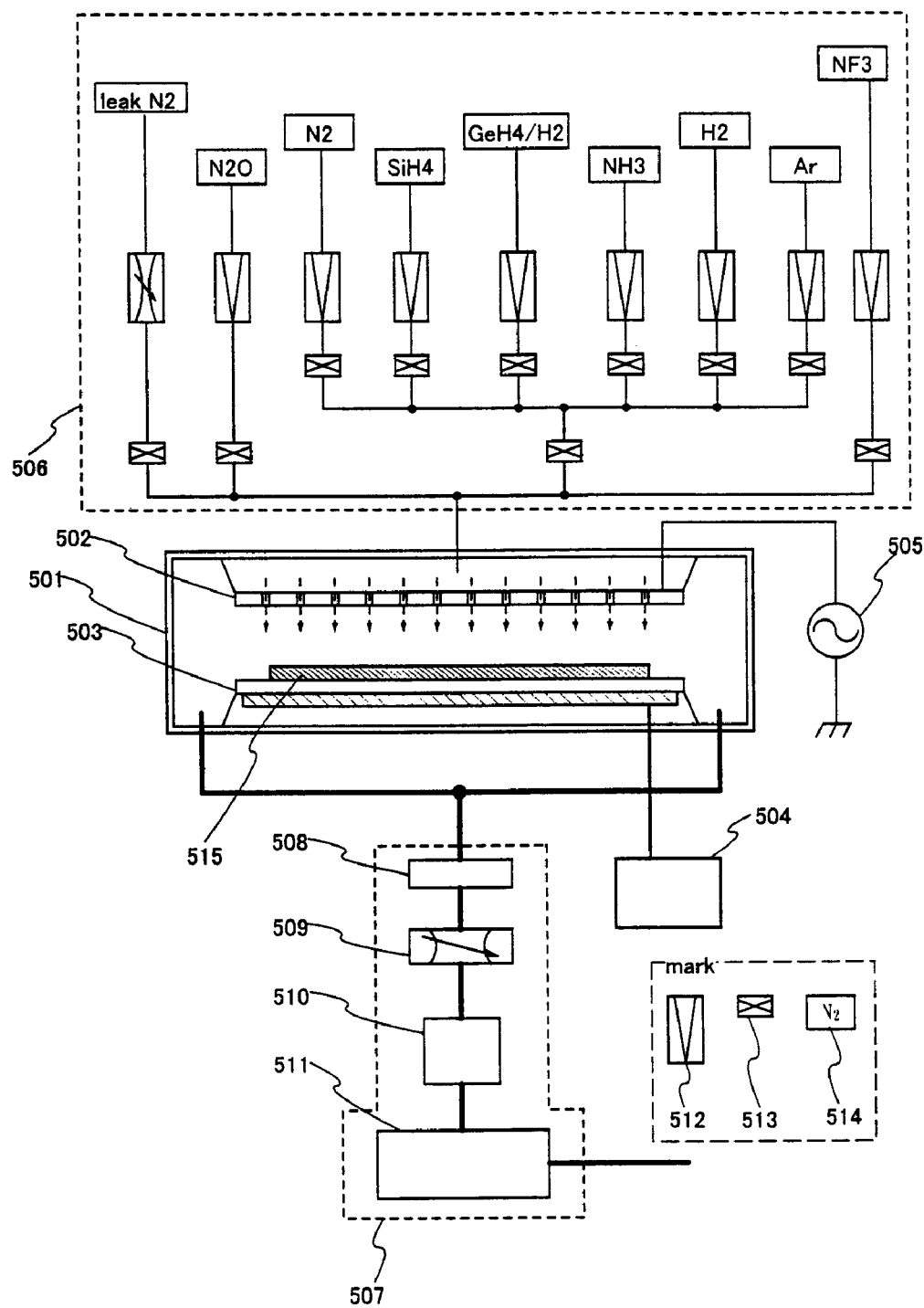
FIG. 5 is a diagram showing the structure of a reaction chamber of the plasma CVD apparatus used in the present invention.

FIG. 5 illustrates in detail the structure of one of reaction chambers of a plasma CVD apparatus as above. The reaction chamber illustrated as an example is one for forming an amorphous semiconductor film. A reaction chamber 501 is of parallel flat type and is provided with a cathode 502 connected to a high frequency power 505, and an anode 503. The cathode 502 is a shower plate through which reaction gas is supplied to the reaction chamber from gas supplying means 506. The anode 503 is provided with heating means such as a sheathed heater, and a substrate 515 is placed on top. Details of the gas supplying system are omitted here but, to describe it briefly, the system is composed of a cylinder 514, a mass flow controller 512, a stop valve 513, and the like. The cylinder 514 is filled with $SiH_4$, $GeH_4$, or other gas, and the mass flow controller 512 controls the flow rate of the gas. Exhaust means 507 is composed of a gate valve 508, an automatic pressure control valve 509, a turbomolecular pump (or a compound molecular pump) 510, and a dry pump 511. The turbo molecular pump (or a compound molecular pump) 510 and the dry pump 511 do not use grease to completely eliminate the possibility of staining the reaction chamber with spattered oil. The reaction chamber has a volume of 13 L. The turbomolecular pump has an exhaust rate of 300 l/sec and is provided on the first stage of the reaction chamber whereas the dry pump has an exhaust rate of 40 m$^3$/hr and is provided on the second stage of the reaction chamber so as to prevent reverse diffusion of evaporated organic material from the exhaust system side. The pumps also enhance the attained vacuum in the reaction chamber and as prevent as possible impurity element from mixing in the amorphous semiconductor film during its formation.

Using an amorphous semiconductor film formed under the above conditions, the orientation ratio of the crystalline semiconductor film formed by the above crystallization method is obtained by electron backscatter diffraction pattern (EBSP). EBSP is a method of analyzing the crystal orientation from backscatter of the primary electron by setting a dedicated detector in a scanning electron microscope (SEM) (hereinafter this method is called an EBSP method for conveniences' sake). An estimation of a crystalline semiconductor film employing EBSP can be found in "Microtexture Analysis of Location Controlled Large Si Grain Formed by Exciter-Laser Crystallization Method", R. Ishihara and P. F. A. Alkemade, AMLCD '99 Digest of Technical Papers. 1999, Tokyo, Japan, PP. 99-102.

In this measurement method, if an electron beam enters the sample having a crystal structure, inelastic scattering takes place also in the rear. There can also be observed a linear pattern peculiar to the crystal orientation by Bragg diffraction of the sample in inelastic scattering (the pattern is commonly called a Kikuchi image). The EBSP method obtains the crystal orientation of the sample by analyzing the Kikuchi image projected onto the screen of the detector. Information of the crystal direction or orientation can be obtained for a planar sample by the mapping measurement in which the point which hit the electron beam on the sample is moved along and the orientation analysis is repeated as the point is moved. The thickness of the incident electron beam varies depending on the type of the electron gun attached to the scanning electron microscope. In the case of the Schottoky electric field discharge type, the gun emits a very thin electron beam with a diameter of 10 to 20 nm. The mapping measurement can provide more averaged information of the crystal orientation when the number of measurement points is greater and the area of the measurement range is wider. In a practical measurement, an area of 100×100 μm$^2$ is measured at about 10000 points (the distance between two points is 1 μm) to 40000 points (the distance between two points is 0.5 μm).

When the crystal direction is obtained for all of the crystal grains by the mapping measurement, the crystal orientation state relative to the film can be expressed statistically. FIG. 6A shows an example of reverse pole diagram obtained by the EBSP method. A reverse pole diagram is often used when the major orientation of a polycrystal is shown, and it collectively illustrates which lattice plane coincides with a specific face of the sample (here, the film surface).

The fan-shaped frame in FIG. 6A is the one generally called a standard triangle in which all indexes related to the cubic system are included. In FIG. 6A, the length corresponds to the angle in the crystal direction. For instance, the distance between {001} and {101} is 45°, the distance between {101} and {111} is 35.26°, and the distance between {111} and {001} is 54.74°. The white dotted lines respectively indicate a range of offset angle of 5° and a range of offset angle of 10° from {101}.

FIG. 6A is obtained by plotting all of the measurement points (11655 points in this example) in the mapping measurement onto the standard triangle. The points are dense in the vicinity of {101}. FIG. 6B translates concentration of points of FIG. 6A into contour. This is a value of an orientation distribution function for expressing as contour the concentration (the density of the points in FIG. 6A) premised on random orientation. When assuming that the orientation of crystal grains is completely random, namely, when the points are evenly distributed throughout the standard triangle, the numeric values here show magnification and are dimensionless numbers.

If it is found that there is the major orientation toward a specific index (here. {101}), the level of the major orientation is easy to image when the quantity of crystal grains centered around the specific index is expressed in numeric values. For example, the orientation ratio is expressed by and obtained from the following equation when the orientation ratio is given as the ratio of the points present in the range of offset angle of 5° and the range of offset angle of 10° from {101} to the whole points in the reverse pole diagram of FIG. 6A shown as an example (the ranges are indicated by the white dotted lines in FIG. 6A).

$$\text{the number of measurement points which angle between } \{101\}=\{101\} \text{ lattice plane and film surface is within allowable value orientation ratio/whole points for measurement} \quad \text{Equation 2}$$

Alternatively, this ratio can be described as follows. When the points are distributed heavily around {101} as in FIG. 6A, it is expected in the actual film that although the {101} orientation of the respective crystal grains is substantially perpendicular to the substrate the {101} orientation is arranged with some fluctuation. The acceptable angle for the fluctuation angle is 5° and 10°. Then the number of crystal grains whose {101} orientation is smaller than the acceptable angle is counted to express the ratio of them in numeric values. The orientation ratio can be obtained by setting the acceptable offset angles to 5° and 10° and calculating the ratio of crystal grains that fall within the acceptable ranges as described above.

In the reverse pole diagram shown as an example in FIG. 6A, the peaks respectively represent {101}, {111} and {001}, and the diagram shows that other plane orientations emerge when the offset angle value with respect to {101} large. For example, the {112} orientation emerges when the offset angle with respect to {101} reaches 30°. Accordingly, when EBSP is used to determine the existence ratio of crystal orientations, it is necessary to set an acceptable offset angle for crystal grains that are distributed with fluctuation to such an angle as to exclude any possibility of erroneously counting other indexes in. According to the present inventors, appropriate acceptable offset angle is 10° or less, or 5° or less. When data is collected with the acceptable offset angle set to the angle above, the existence ratio of crystal grains oriented in a specific orientation can be quantified.

FIG. 1 shows the {101} plane orientation ratio of a crystalline semiconductor film as the duty ratio dependency in intermittent electric discharge. The crystalline semiconductor film is obtained by forming an amorphous semiconductor film with a thickness of 54 nm on a quartz substrate based on the above formation conditions, and by subjecting the film to dehydrogenation treatment at 500° C. for an hour and then by heating at 580° C. for four hours. The repetition frequency is set to 10 kHz. It can clearly be read from FIG. 1 that the {101} plane orientation ratio increases when the duty ratio is 60% or less. According to the results in FIG. 1, the orientation ratio is 58% when the duty ratio is 30%.

Figure 2:
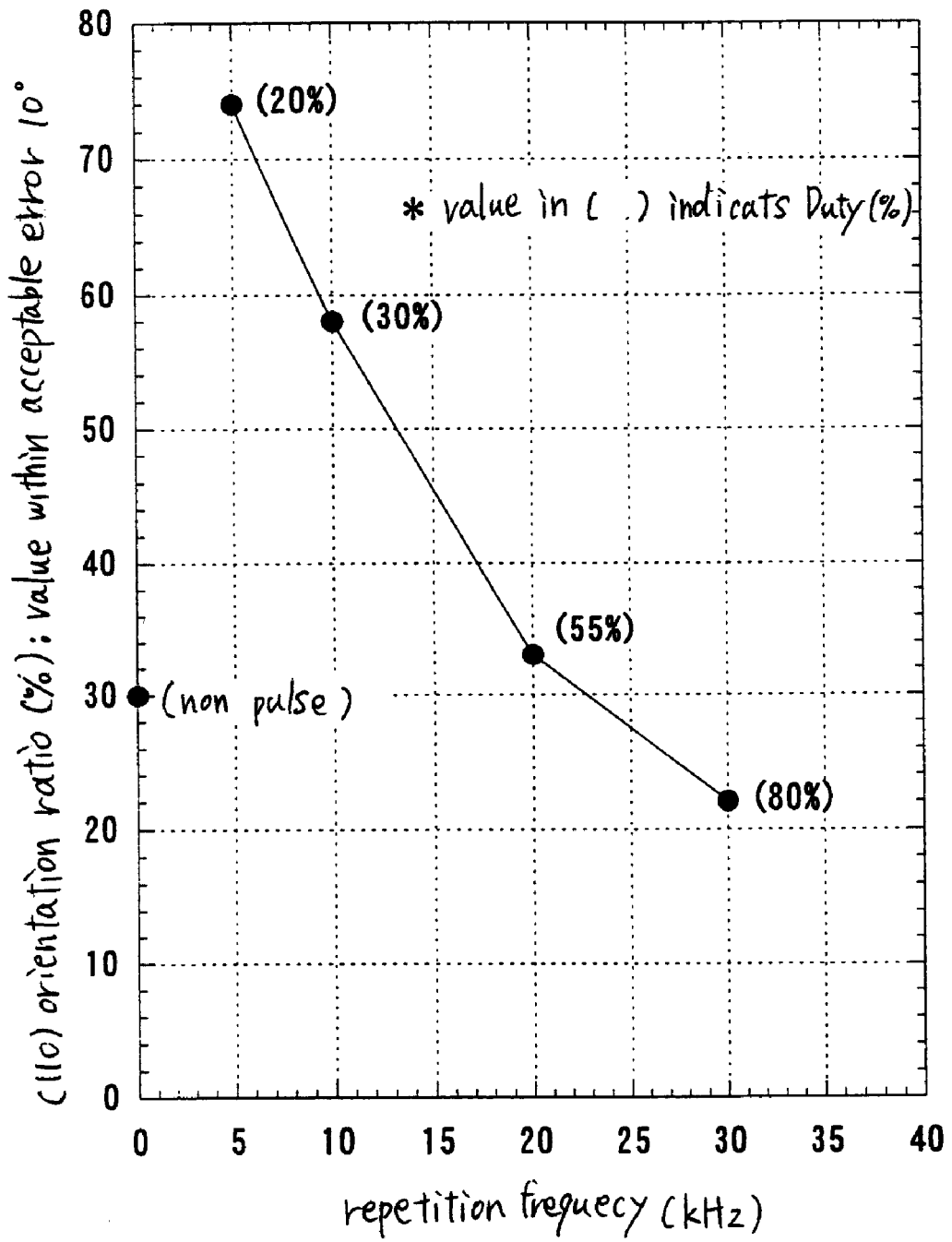
FIG. 2 is a graph containing data for orientation ratio of a crystalline semiconductor film, showing electric discharge duration dependency in intermittent electric discharge as a film formation condition of an early deposition film.

FIG. 2 shows data obtained by plotting the {101} plane orientation ratio while placing the repetition frequency in intermittent electric discharge on the axis of abscissa. The repetition frequency changes from 5 kHz to 30 kHz. As the repetition frequency gets smaller, the {101} plane orientation ratio increases.

Figure 3:
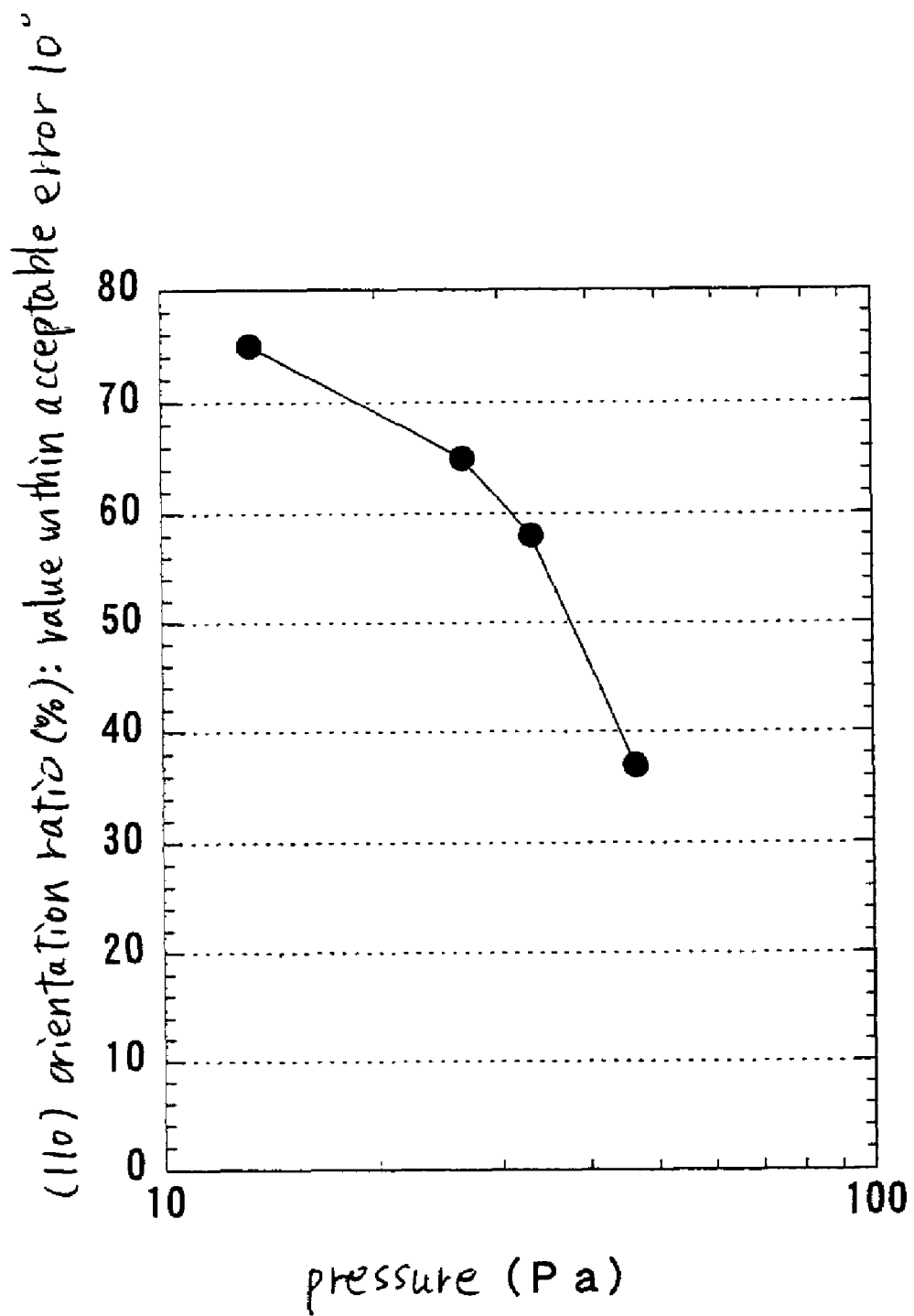
FIG. 3 is a graph containing data for orientation ratio of a crystalline semiconductor film, showing repetition frequency dependency in intermittent electric discharge as a film formation condition of an early deposition film.

FIG. 3 shows the reaction pressure dependency during formation of an amorphous semiconductor film. The {101} plane orientation ratio is raised as the pressure is lowered.

Needless to say, such crystalline semiconductor film exhibiting high orientation with respect to {101} lattice plane is attained not only by deposing an amorphous semiconductor film utilizing setting the repetition frequency the duty ratio, and the reaction pressure, but also by a synergetic effect of setting the concentration of oxygen, nitrogen, and carbon contained in the film to less than $1 \times 10^{19}$ atoms/cm$^3$ and setting the thickness of the film to 20 to 100 nm to make the crystal growth in the direction parallel to the substrate surface dominant.

The crystalline semiconductor film having high {101} lattice plane orientation ratio is suitable for a channel formation region that determines characteristics of an element, such as a channel formation region of a TFT and a photo-electric conversion layer of a photo-electromotive force element.

Embodiment 1

FIGS. 7A to 7D illustrates a method of forming a crystalline semiconductor film in which an amorphous silicon film containing germanium is crystallized by doping the entire surface of the film with a metal element for promoting crystallization of silicon. In FIG. 7A, a substrate 101 is a glass substrate typical example of which is a Corning #1737 glass substrate (product of Corning Incorporated). A blocking layer 102 is formed on the surface of the substrate 101 from a silicon oxynitride film with a thickness of 100 nm by plasma CVD using SiH$_4$ and N$_2$O. The blocking layer 102 is provided in order to prevent an alkaline metal contained in the glass substrate from diffusing into a semiconductor film to be formed on the layer.

An amorphous semiconductor film 103 comprised of silicon and germanium is formed by plasma CVD. GeH$_4$ gas diluted by SiH$_4$ and H$_2$ to 10% is introduced in a reaction chamber and dissolved by glow electric discharge to be deposited on the substrate 101. Details of the conditions thereof are as described in Embodiment Mode. Here, the amorphous semiconductor film 103 is deposited to a thickness of 54 nm through intermittent electric discharge in which 27 MHz high frequency power is modulated, the repetition frequency is set to 5 kHz, and the duty ratio is set to 20%. The mixing ratio of SiH$_4$ and GeH$_4$ is adjusted so that the germanium concentration in the amorphous semiconductor to be formed is 1 to 10 atomic percent, preferably 2 to 3 atomic percent. In order to reduce impurities such as oxygen, nitrogen, and carbon in the amorphous semiconductor film 103 comprised of silicon and germanium as much as possible. SiH$_4$ gas of 99.9999% or higher purity and GeH$_4$ gas of 99.99% or higher purity are used. Specifications of the plasma CVD apparatus to be used are as follows. The reaction chamber has a volume of 13 L. A compound molecular pump having an exhaust rate of 300 l/sec is provided on the first stage of the reaction chamber and a dry pump having an exhaust rate of 40 m₃/hr is provided on the second stage of the reaction chamber so as to prevent reverse diffusion of evaporated organic material from the exhaust system side. The pumps also enhance the attained vacuum in the reaction chamber to let the least possible amount of impurity element mix in the amorphous semiconductor film during its formation.

Then, as shown in FIG. 7B, a nickel acetate solution containing 10 ppm of nickel by weight is applied by spinner to form a nickel containing layer 104. In order to make sure the solution permeates the film well, the surface of the amorphous semiconductor film 103 comprised of silicon and germanium is treated. As the surface treatment, a very thin oxide film is formed using an aqueous solution containing ozone, the oxide film is etched using a mixture of hydrofluoric acid and hydrogen peroxide to form a clean surface, and a very thin oxide film is again formed by treatment using an aqueous solution containing ozone. With the oxide film formed as above, the nickel acetate solution can be applied uniformly to the silicon surface, which is inherently hydrophobic.

Next, heat treatment is conducted at 500° C. for an hour so that hydrogen is released from the amorphous semiconductor film comprised of silicon and germanium. Then the film is subjected to another heat treatment at 580° C. for four hours to crystallize the film. Thus a crystalline semiconductor film 105 shown in FIG. 7C is formed.

In order to enhance the crystallization ratio (the ratio of crystalline components to the total volume of the film) and repair defects remaining in crystal grains, the crystalline semiconductor film 105 is subjected to laser treatment in which the film is irradiated with laser light 106. The laser used is an excimer laser having a wavelength of 308 nm and oscillating at 30 Hz. The laser light is collected by an optical system into a beam of 100 to 300 mJ/cm², and laser treatment is conducted with the overlapping ratio set to 90 to 95% without melting the semiconductor film. Thus a crystalline semiconductor film 107 comprised of silicon and germanium, which is shown in FIG. 7D, can be obtained.

Embodiment 2

Figure 8A:
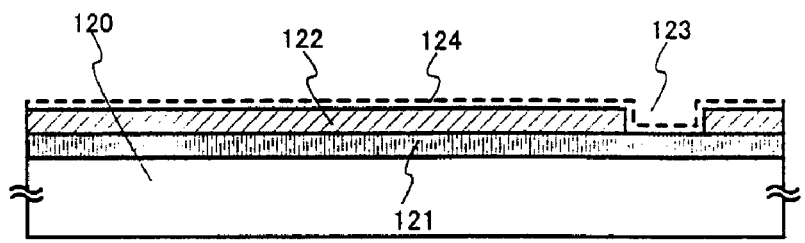
FIGS. 8A to 8C are diagrams illustrating a method of forming a crystalline semiconductor film according to the present invention.

A method of selectively introducing an element for promoting crystallization of an amorphous semiconductor film will be described with reference to FIGS. 8A to 8C. In FIG. 8A, a substrate 120 may be the aforementioned glass substrate or a quartz substrate. When the glass substrate is employed, a blocking layer is formed as in Embodiment 1.

An amorphous semiconductor film 121 comprised of silicon and germanium is formed by plasma CVD using intermittent electric discharge or pulsed electric discharge as in Embodiment 1.

A silicon oxide film 122 with a thickness of 150 nm is formed on the amorphous semiconductor film 121 comprised of silicon and germanium. The method of forming the silicon oxide film is not limited. For example, the film is formed through electric discharge in which a mixture of tetraethyl ortho silicate (TEOS) and $O_2$ is used, the reaction pressure is set to 40 Pa, the substrate temperature is set to 300 to 400° C., and the high frequency (13.56 MHz) power density is set to 0.5 to 0.8 W/cm².

Next, an opening 123 is formed in the silicon oxide film 122 and a nickel acetate solution containing 10 ppm of nickel by weight is applied to the film. A nickel containing layer 124 is thus formed and the only part of the nickel containing layer 124 that is in contact with the amorphous semiconductor film 121 is at the bottom of the opening 123.

Figure 8B:
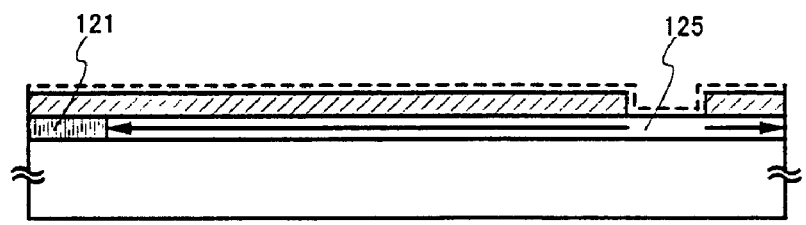
Figure 8C:
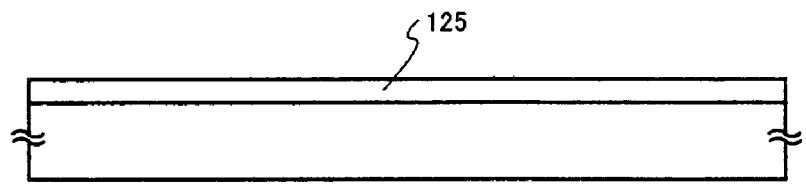

In FIG. 8B, the film is crystallized by heat treatment at 500 to 650° C. for four to twenty-four hours, for example, at 570° C. for fourteen hours. In this case, a part of the amorphous silicon film that is in contact with nickel is crystallized first and the crystallization advances from that part in the direction parallel to the substrate surface. A crystalline silicon film 125 is thus formed. The crystalline silicon film 125 is masses of rod-like or needle-like crystals, and each crystal grows with a specific directivity when viewed macroscopically. The silicon oxide film 122 is then removed to complete the crystalline semiconductor film 125 comprised of silicon and germanium, which is shown in FIG. 8C.

Embodiment 3

The crystalline semiconductor film formed in accordance with the method described in Embodiment 1 or 2 still has the element that has been utilized in crystallization, typically, nickel. Although not distributed in the film uniformly, the element remains in a concentration over $1 \times 10^{19}$ atoms/cm³ on the average. The film in this state can be used for a TFT and a channel formation region of other various semiconductor devices, of course, but it is preferred to remove the element from the film by gettering.

Figure 9A:
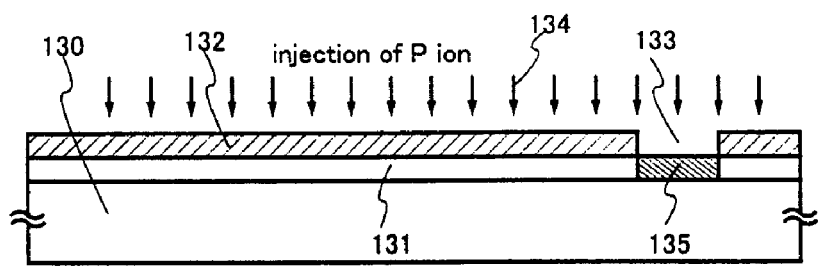
FIGS. 9A to 9C are diagrams illustrating a method of forming a crystalline semiconductor film according to the present invention.
Figure 9B:
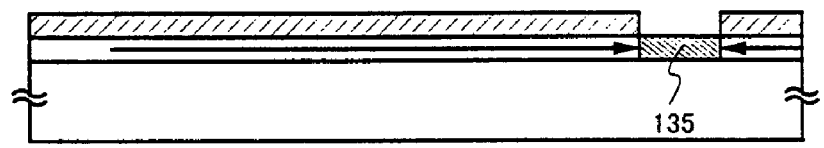
Figure 9C:
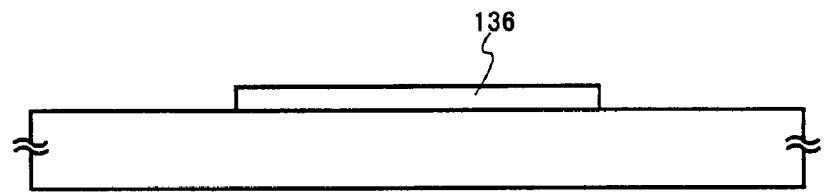

This embodiment describes an example of the gettering method with reference to FIGS. 9A to 9C. In FIG. 9A, the glass substrate of Embodiment 1 or a quartz substrate is employed as a substrate 130. When the glass substrate is used, a blocking layer is formed similar to Embodiment 1. A crystalline semiconductor film 131 is formed by the method described in Embodiment 1 or the method described in Embodiment 2. On the surface of the crystalline semiconductor film 131, a silicon oxide film 132 to serve as a mask is formed to a thickness of 150 nm. An opening 133 is formed in the silicon oxide film to expose a part of the crystalline semiconductor film. If the film is formed in accordance with Embodiment 2, the silicon oxide film 122 shown in FIG. 8A can be used for the film 132 as it is, proceeding to the step of this embodiment after the step of FIG. 8B is completed. Then the film is doped with phosphorus by ion doping to form a phosphorus-doped region 135 that contains phosphorus in a concentration of $1 \times 10^{19}$ to $1 \times 10^{22}$ atoms/cm³.

Thereafter, heat treatment is conducted in a nitrogen atmosphere at 550 to 800° C. for five to twenty-four hours, for example, at 600° C. for twelve hours. Through the heat treatment, the phosphorus-doped region 135 works as a gettering site as shown in FIG. 9B, and the catalytic element remained in the crystalline semiconductor film 131 is segregated in the phosphorus-doped region 135.

After that, the silicon oxide film 132 that has served as a mask and the phosphorus-doped region 135 are removed by etching as shown in FIG. 9C. Thus obtained is a crystalline semiconductor film 136 in which the concentration of the metal element used in the crystallization step is reduced to less than $1 \times 10^{17}$ atoms/cm³.

Embodiment 4

Figure 11A:
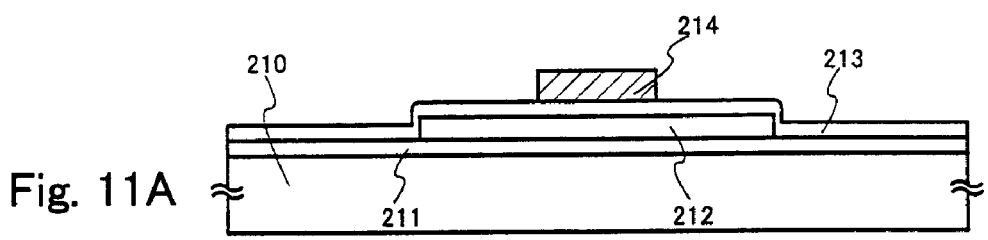
FIGS. 11A to 11C are diagrams illustrating a process of manufacturing a TFT using a crystalline semiconductor film according to the present invention.
Figure 11B:
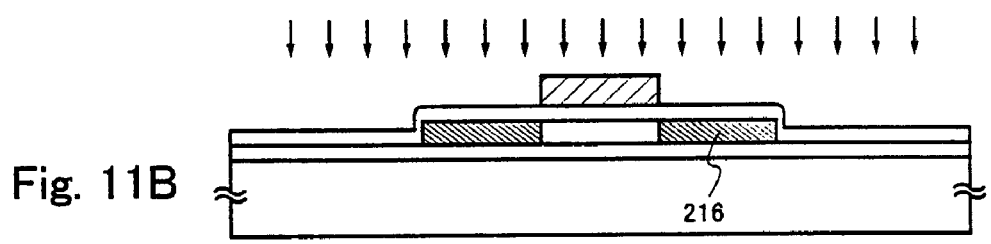
Figure 11C:
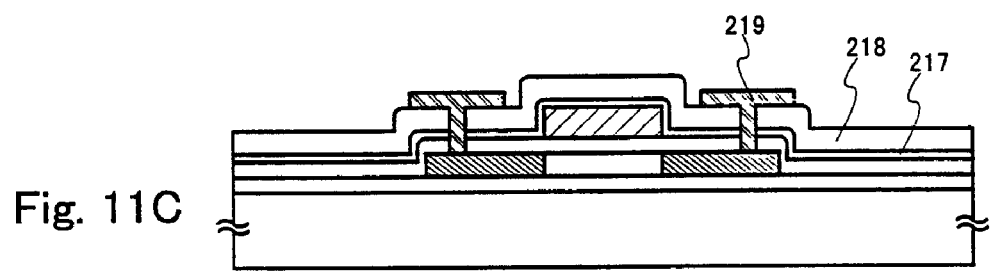

Now, a description will be given on an example of manufacturing a TFT from the crystalline semiconductor film comprised of silicon and germanium as above. FIGS. 11A to 11C are diagrams illustrating the manufacturing process of this embodiment.

In FIG. 11A, a crystalline semiconductor film 212 comprised of silicon and germanium is formed on a substrate 210. As the crystalline semiconductor film 212, a crystalline semiconductor film formed in accordance with one of the methods of Embodiments 1 to 3 is employed. In manufacturing a TFT from the film, the film is etched and divided into island-like films having given sizes in order to separate elements. When the substrate 210 is a glass substrate, a blocking layer 211 is formed.

An insulating film 213 to be utilized as a gate insulating film in the TFT is formed to a thickness of 30 to 200 nm. The insulating film 213 is a silicon oxynitride film formed by plasma CVD from $SiH_4$ and $N_2O$, or a silicon oxynitride film formed from TEOS and $N_2O$ by plasma CVD. In this embodiment, the former film is chosen and the thickness thereof is set to 70 nm.

On the insulating film 213, a gate electrode 214 is formed from a conductive material composed of one or more elements selected from the group consisting of tantalum, tungsten, titanium, aluminum and molybdenum.

Thereafter, an impurity region 216 having one conductivity type is formed as shown in FIG. 11B for forming a source and drain region of the TFT. The impurity region 216 is formed by ion doping. The film is doped with a Group 15 element in the periodic table, typically, phosphorus or arsenic, if an n-channel TFT is to be manufactured, whereas a Group 13 element in the periodic table, typically, boron, is used for the doping if it is a p-channel TFT that is to be manufactured.

A first interlayer insulating film 217 is then formed using a silicon nitride film or a silicon oxynitride film formed by plasma CVD. The first interlayer insulating film 217 is formed by plasma CVD while setting the substrate temperature at 200 to 300° C., and then is subjected to heat treatment in a nitrogen atmosphere at 350 to 450° C., preferably 410° C. At this temperature, hydrogen is released from the first interlayer insulating film. Thereafter, another heat treatment is performed at 250 to 350° C. lasting about 0.1 to 1 hour to hydrogenate the crystalline semiconductor film. Hydrogenating the crystalline semiconductor film through two-step heat treatment as above makes it possible to hydrogenate and compensate dangling bonds (uncoupled bonds) of germanium, which is difficult to hydrogenate especially at a temperature of 350° C. or higher. A source and drain electrode 218 is then formed to complete the TFT.

Although the TFT shown here has a single gate structure, the TFT may of course take a multi-gate structure in which a plurality of gate electrodes are provided.

The crystalline semiconductor film comprised of silicon and germanium and obtained by the present invention has high {101} plane orientation ratio and can form a channel formation region that shows excellent interface characteristics regarding the interface with the gate insulating film. The crystalline semiconductor film is also low in defect density in crystal grain boundaries and inside crystal grains, and can provide high electric field effect mobility. The description here is given with the TFT having a single drain structure. However, a TFT having a lightly doped drain (LDD) structure or a TFT in which an LDD region overlaps a gate electrode can also be formed. The TFT fabricated in accordance with the present invention can be used as a TFT for manufacturing an active matrix liquid crystal display device or EL display device, or as a TFT constituting a thin film integrated circuit that is to replace the conventional LSI formed from a semiconductor substrate.

Embodiment 5

Figure 10:
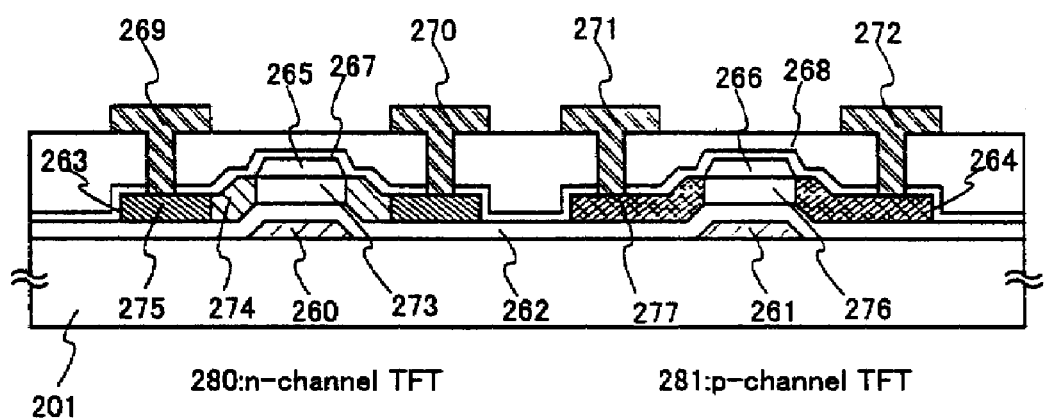
FIG. 10 is a sectional view illustrating the structure of a reverse stagger TFT using a crystalline semiconductor film of the present invention.

FIG. 10 is a sectional view of a reverse stagger TFT manufactured from a crystalline semiconductor film composed of silicon and germanium in accordance with the present invention. In the reverse stager TFT, gate electrodes 260 and 261 are formed on a glass or quartz substrate 201, and crystalline semiconductor films 263 and 264 containing silicon and germanium as their ingredients are formed on a gate insulating film 262. The crystalline semiconductor films 263 and 264 may be any of the crystalline semiconductor films formed in accordance with the methods of Embodiments 1 through 3.

An n-channel TFT 280 is formed from the crystalline semiconductor film 263. The TFT 280 has a channel formation region 273, an LDD region 274 that is formed by doping of an n-type impurity element (donor), and a source or drain region 275. A p-channel TFT 281 is formed from the crystalline semiconductor film 264. The TFT 281 has a channel formation region 276 and a source or drain region 277 formed by doping of a p type impurity element (acceptor).

Channel protective films 265 and 266 are formed on the channel formation regions 273 and 276, respectively. Source or drain electrodes 269 to 27 are formed through a first interlayer insulating film 267 and a second interlayer insulating film 268. The first interlayer insulating film 267 is formed from a silicon nitride film or a silicon oxynitride film. Thereafter, the film is subjected to heat treatment in an nitrogen atmosphere at 350 to 450° C., preferably 410° C. At this temperature, hydrogen is released from the first interlayer insulating film. Then another heat treatment is performed at 250 to 350° C., lasting about 0.1 to 1 hour to hydrogenate the crystalline semiconductor film.

A reverse stagger TFT as above also can construct a driver circuit of an active matrix liquid crystal display device or EL display device. Other than the driver circuit, an n-channel TFT or a p-channel TFT as the one described above can be applied to a transistor constituting a pixel portion. Although the TFT shown here has a single gate structure, the TFT may of course take a multi-gate structure in which a plurality of gate electrodes are provided. The TFT of this embodiment can be used as a TFT constituting a thin film integrated circuit that is to replace the conventional LSI formed from a semiconductor substrate.

Embodiment 6

A description given in this embodiment with reference to FIGS. 12A to 12F is about an example of manufacturing a CMOS TFT obtained by combining an n-channel TFT and a p-channel TFT complementarily. In FIG. 12A, a crystalline semiconductor film composed of silicon and germanium is formed on a substrate 301. The crystalline semiconductor film may be any one of crystalline semiconductor films formed in accordance with the methods of Embodiments 1 through 3. In manufacturing a TFT from the film, the film is etched and divided into island-like semiconductor films 331 to 333 having given sizes in order to separate elements. When the substrate 301 is a glass substrate, a blocking layer 302 is formed.

For the blocking layer 302, a silicon oxynitride film is formed by plasma CVD using $SiH_4$ and $N_2O$ to a thickness of 50 to 200 nm. Alternatively, the blocking layer may have a two-layer structure in which a silicon oxynitride film formed from $SiH_4$, $NH_3$ and $N_2O$ by plasma CVD to a thickness of 50 nm and a silicon oxynitride film formed from SiH$_4$ and N$_2$O to a thickness of 100 nm are layered. The two-layer structure may instead be obtained by layering a silicon nitride film and a silicon oxide film that is formed using TEOS.

The blocking layer 302 and an amorphous semiconductor film to be formed on the blocking layer may both be formed by plasma CVD. Therefore these layers can be formed in succession in the same reaction chamber of a single chamber CVD apparatus, or in a multi-chamber CVD apparatus where the substrate is moved from one reaction chamber to another reaction chamber. In either case, the blocking layer and the amorphous semiconductor film are formed without being exposed to the air, thereby keeping the interface between the two clean.

An insulating film 334 to be utilized as a gate insulating film is formed by plasma CVD or sputtering to a thickness of 40 to 150 nm. In this embodiment, a silicon oxynitride film with a thickness of 70 nm is formed as the film 334. A material particularly preferable as the gate insulating film is a silicon oxynitride film formed from SiH$_4$ and N$_2$O added with O$_2$, for the fixed charge density in this film is low. The gate insulating film is not limited to the silicon oxynitride film given above, of course, but it may be a single layer of insulating films such as a silicon oxide film and a tantalum oxide film, or a laminate of those insulating films.

A first conductive film 335 and a second conductive film 336 for forming gate electrodes are formed on the insulating film 334. In this embodiment, the first conductive film 335 is a tantalum nitride film or a titanium film with a thickness of 50 to 100 nm whereas the second conductive film 336 is a tungsten film with a thickness of 100 to 300 nm. These materials are stable in heat treatment conducted in a nitrogen atmosphere at 400 to 600° C., and do not increase the resistivity much.

Next, a resist mask 337 is formed as shown in FIG. 12B to conduct first etching treatment for forming the gate electrodes. The etching method is not limited to a particular method but, preferably, the ICP (inductively coupled plasma) etching is employed. In the etching treatment, CF$_4$ and Cl$_2$ are mixed as etching gas, and plasma is generated by giving RF (13.56 MHz) power of 500 W to a coiled electrode at a pressure of 0.5 to 2 Pa, preferably 1 Pa. RF (13.56 MHz) power of 100 W is also given to the substrate side (sample stage) so that substantially negative self-bias voltage can be applied. In the case where mixture of CF$_4$ and Cl$_2$ is used, the tungsten film and the tantalum nitride film or the titanium film are etched at almost the same rate.

Under the etching conditions given in the above, the edges of the films can be tapered by the shape of the resist mask and the effect of the bias voltage applied to the substrate side. The angle of the tapered portion is set to 15 to 45°. In order to etch the films without leaving any residue on the gate insulating film, the etching time is prolonged by about 10 to 20%. The selective ratio of the silicon oxynitride film to the W film is 2 to 4 (typically, 3), and hence the exposed surface of the silicon oxynitride film is etched by about 20 to 50 nm through the over-etching treatment. Through the first etching treatment, first shape conductive layers 338 to 340 (first conductive layers 338a to 340a and second conductive layers 338b to 340b) are formed from the first conductive film and the second conductive film. Denoted by 341 is a gate insulating film and a region of the gate insulating film which is not covered with the first shape conductive layers is etched and thinned by about 20 to 50 nm.

Second etching treatment is then conducted as shown in FIG. 12C. In this etching treatment, ICP etching is employed, CF$_4$, Cl$_2$ and O$_2$ are mixed as etching gas, and plasma is generated by giving RF (13.56 MHz) power of 500 W to a coiled electrode at a pressure of 1 Pa. RF (13.56 MHz) power of 50 W is also given to the substrate side (sample stage) so that a self-bias voltage lower than that of the first etching treatment can be applied. The tungsten film is subjected to anisotropic etching under these conditions so that the tantalum nitride film or the titanium film serving as the first conductive layers is remained. In this way, second shape conductive layers 342 to 344 (first conductive films 342a to 344a and second conductive films 342b to 344b) are formed. Denoted by 345 is a gate insulating film and a region of the gate insulating film which is not covered with the second shape conductive layers 342 to 344 is further etched and thinned by about 20 to 50 nm.

Then first doping treatment is performed. In this doping treatment, the film is doped with an n type impurity (donor) to form LDD regions of the n-channel TFT. The doping is made by ion doping or ion implantation. For example, ion doping is employed and the acceleration voltage is set to 70 to 120 keV while the dose is set to $1\times10^{13}$ atoms/cm$^2$ to form first impurity regions. When the film is doped, the second conductive films 342b to 344b are used as masks against the impurity element and regions under the first conductive films 342a to 344a are doped with the impurity element. In this way, first impurity regions 346 to 348 are formed to partially overlap the first conductive films 342a to 344b, respectively. The first impurity regions contains the impurity element in a concentration of $1\times10^{17}$ to $1\times10^{19}$ atoms/cm$^3$.

Next, masks 349 to 351 are formed from a resist as shown in FIG. 12D to conduct second doping treatment. In the second doping treatment, an n type impurity (donor) is used to form a source or drain region of the n-channel TFT. Ion doping is employed and the dose is set to $1\times10^{13}$ to $5\times10^{14}$ atoms/cm$^2$. Used as the n type impurity element is an element belonging to Group 15, typically phosphorus (P) or arsenic (As). The resist masks 349 to 351 can have their respective shapes optimized. By shaping the resist masks so as to extend over the ends of the second shape conductive layers and overlap the first impurity regions previously formed, the LDD regions can be obtained. Second impurity regions 352 to 354 are thus formed. The phosphorus (P) concentration in the second impurity regions 352 to 354 is set to $1\times10^{20}$ to $1\times10^{21}$ atoms/cm$^3$.

Then a resist mask 355 is formed as shown in FIG. 12E so that the island-like semiconductor layer 331 for forming the p-channel TFT is doped with a p type impurity (acceptor). Typically, boron (B) is used. The impurity concentration in third impurity regions 356 and 357 is set to $2\times10^{20}$ to $2\times10^{21}$ atoms/cm$^3$. Thus the regions are doped with boron in a concentration 1.5 to 3 times higher than the concentration of phosphorus that has already been contained in the regions, thereby inverting the conductivity type of the regions.

The impurity regions are formed in the respective island-like semiconductor layers through the above steps. The second shape conductive layers 342 to 344 form gate electrodes. Thereafter, as shown in FIG. 12F, a protective insulating film 358 is formed from a silicon nitride film or a silicon oxynitride film by plasma CVD. The impurity elements used to dope the island-like semiconductor layers are then activated for controlling the conductivity type. The activation is preferably made by thermal annealing that uses an annealing furnace. Laser annealing or rapid thermal annealing (RTA) may be employed instead. Thermal annealing is conducted in a nitrogen atmosphere having an oxygen concentration of 1 ppm or less, preferably 0.1 ppm or less, at 400 to 700° C., typically 400 to 600° C. In this embodiment, the film is subjected to heat treatment at 500° C. for four hours.

A silicon nitride film 359 is formed and subjected to heat treatment at 350 to 450° C., preferably 410° C. At this temperature, hydrogen is released from the first interlayer insulating film. Thereafter, another heat treatment is performed at 250 to 350° C., lasting about 0.1 to 1 hour to hydrogenate the crystalline semiconductor film. Hydrogenating the crystalline semiconductor film through two-step heat treatment as above makes it possible to hydrogenate and compensate dangling bonds (uncoupled bonds) of germanium, which is difficult to hydrogenate especially at a temperature of 350° C., or higher.

An interlayer insulating film 360 is formed of an organic insulating material such as polyimide and acrylic in order to level the surface. A silicon oxide film formed by plasma CVD using TEOS may of course be adopted instead, but it is desirable to choose the above organic insulating material from the viewpoint of better levelness.

Contact holes are formed next, so that source or drain wiring lines 361 to 366 are formed from aluminum (Al), titanium (Ti), tantalum (Ta) or the like.

A p-channel TFT 370 has a channel formation region 367, and has the second impurity region 356 that function as source region or drain region and the first impurity region 357. An n-channel TFT 371 has a channel formation region 368; the first impurity region 347 overlapping the gate electrode that is formed of the second shape conductive layer 343; and the second impurity region 353 functioning as a source region or a drain region. An n-channel TFT 372 has a channel formation region 369; the first impurity region 348a overlapping the gate electrode that is formed of the second shape conductive layer 344; the second impurity region 348b formed outside the gate electrode; and the third impurity region 354 functioning as a source region or a drain region. The second impurity regions 347 and 348a are LDD regions overlapping gate electrodes, and are effective in easing high electric field regions formed on the drain ends to prevent degradation of TFTs due to hot carriers. The first impurity region 348b is an LDD region and, according to the process shown in this embodiment, can have dimensions optimum for reducing OFF current value.

Through the above steps, a CMOS TFT in which an n-channel TFT and a p-channel TFT are combined complementarily can be obtained. The process shown in this embodiment allows designing LDD regions while considering the characteristics required for the respective TFTs, so that TFTs having their respective optimum structures are formed on the same substrate. The CMOS TFT as such can be used to form a driver circuit of an active matrix liquid crystal display device or EL display device. Other than this use, the n-channel TFT or the p-channel TFT as above can be applied to a transistor constituting a pixel portion. The TFT may also be used as a TFT constituting a thin film integrated circuit that is to replace the conventional LSI formed from a semiconductor substrate. Although the TFT shown here has a single gate structure, the TFT may of course take a multi-gate structure in which a plurality of gate electrodes are provided.

Using the CMOS circuit of this embodiment in combination, a basic logic circuit or a more intricate logic circuit (such as a signal divider circuit, a D/A converter, an operation amplifier and a γ correction circuit) can be formed. It also can constitute a memory or a microprocessor.

Embodiment 7

Figure 13:
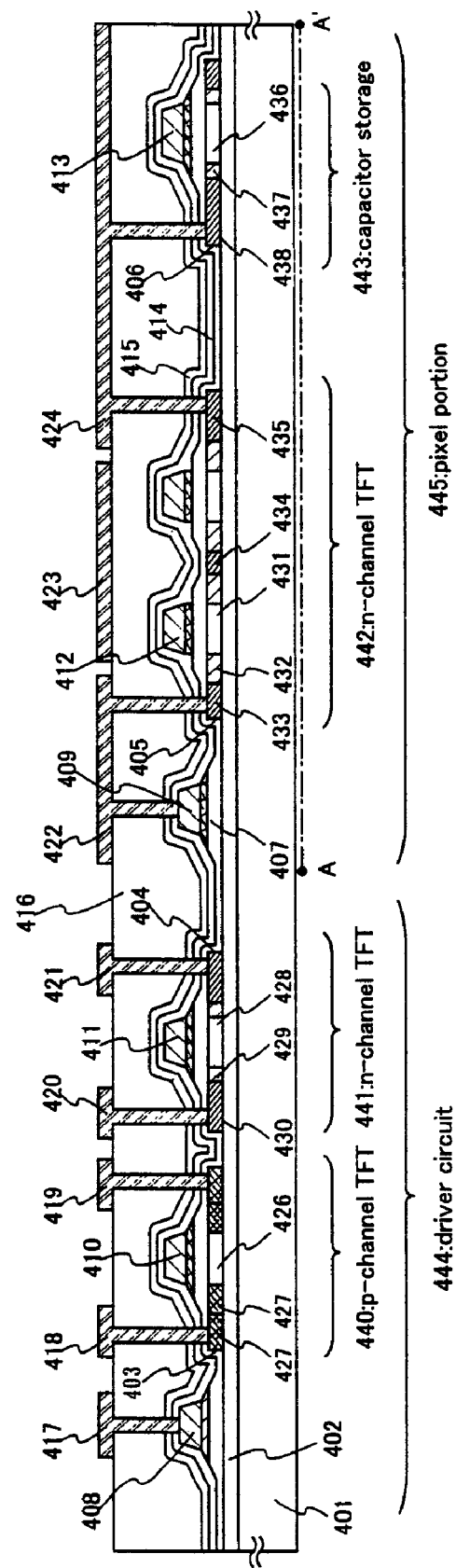
FIG. 13 is a sectional view illustrating the structure of a display device using a crystalline semiconductor film according to the present invention.
Figure 14:
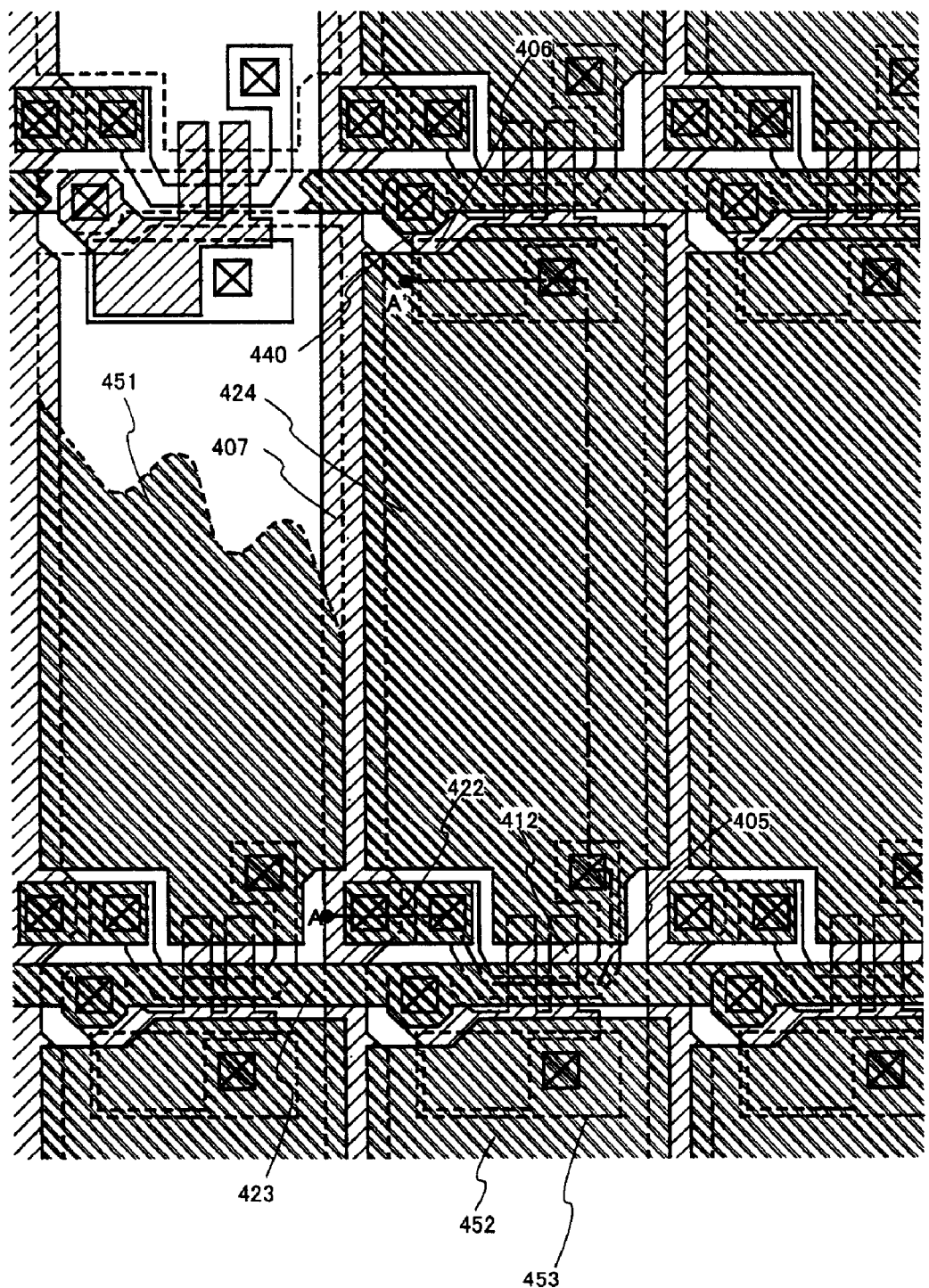
FIG. 14 is a top view of a pixel structure in a pixel portion.

This embodiment gives a description on an example of the structure of a monolithic liquid crystal display device with reference to FIGS. 13 and 14. A monolithic liquid crystal display device is a device in which a pixel portion and a driver circuit are formed on the same substrate. A crystalline semiconductor film of the present invention which is comprised of silicon and germanium is used to form an active region of a switching TFT for the pixel portion and active regions of n-channel and p-channel TFTs for the driver circuit. The crystalline semiconductor film comprised of silicon and germanium may be any one of the crystalline semiconductor films formed in accordance with the methods of Embodiments 1 through 3.

A substrate 401 in FIG. 13 is preferably a glass substrate such as barium borosilicate glass substrate or an aluminoborosilicate glass substrate. A quartz substrate may be used instead. When the substrate 401 is a glass substrate, a blocking layer 402 is formed.

The structure is not limited for the n-channel TFT 442 of the pixel portion 445 and for an n-channel TFT 441 and a p-channel TFT 440 of a driver circuit 444. This embodiment employs as the basic structure a TFT formed in accordance with Embodiment 6. Needless to say, a TFT according to Embodiment 4 or a TFT according to Embodiment 5 may also be employed.

In the driver circuit 444, wiring lines 408 and 417, and source or drain wiring lines 418 to 421 are formed. In the pixel portion 445, a pixel electrode 424, a gate wiring line 423, a connection electrode 422 and a source wiring line 409 are formed.

The p-channel TFT 440 of the driver circuit 444 has, in a semiconductor layer 403, a channel formation region 426 and a third impurity region 427 that functions as a source region or a drain region. The third impurity region is formed outside a gate electrode 410 (at a position where the region does not overlap the gate electrode). The p-channel TFT structured as above is obtained by removing the resist masks after the step of FIG. 12D to selectively etch the first conductive film, and then doping the film with a p-type impurity element.

The n-channel TFT 441 has, in a semiconductor layer 404, a channel formation region 428; a first impurity region 429 overlapping a gate electrode that is formed of a second shape conductive layer 411; and a second impurity region 430 functioning as a source region or a drain region. The n-channel TFT 441 can be fabricated in the same way as the n-channel TFT 371 of Embodiment 6. The crystalline semiconductor film obtained by the present invention which is comprised of silicon and germanium has high {101} plane orientation ratio, is low in defect density in crystal grain boundaries, and can provide high electric field effect mobility. When constituted of such TFT, the driver circuit can operate at a higher frequency.

The n-channel TFT 442 of the pixel portion has, in a semiconductor layer 405, a channel formation region 431; a first impurity region 432 formed outside a gate electrode (the region 432 is an LDD region); and second impurity regions 433, 434 and 435 functioning as source regions or drain regions. The n-channel TFT structured as above is obtained by removing the resist masks after the step of FIG. 12D to selectively etch the first conductive film. However, in order to maintain the structure of the n-channel TFT 441, a protective resist layer has to be formed and one more photo mask is required to form the protective resist layer. A semiconductor layer 406 functions as one of electrodes of a capacitor storage 443, and has a sixth impurity region 437, a fifth impurity region 438, and a region 436 that is not doped with an impurity In the pixel portion 445, the source wiring line 409 is electrically connected through the connection electrode 422 to the source or drain region 433 of the n-channel TFT 442 of the pixel portion. The gate wiring line 423 is electrically connected to the third shape conductive layer 412 that functions as a gate electrode. The pixel electrode 424 is connected to the source or drain region 435 of the n-channel TFT 442 of the pixel portion and to the impurity region 438 of the semiconductor film 406 that is one of electrodes of the capacitor storage 443.

The sectional view of the pixel portion 445 in FIG. 13 is taken along the line A-A' in FIG. 14. The third shape conductive layer 412 functioning as a gate electrode doubles as one of electrodes of a capacitor storage of an adjacent pixel, and partially overlaps a semiconductor layer 453 that is connected to a pixel electrode 452 to form a capacitance. The source wiring line 407, the pixel electrode 424 and an adjacent pixel electrode 451 are arranged such that the ends of the pixel electrodes 424 and 451 are placed on the source wiring line 407 to form an overlapping portion. The overlapping portion blocks stray light and enhances light-shielding property of the device.

Embodiment 8

Figure 15:
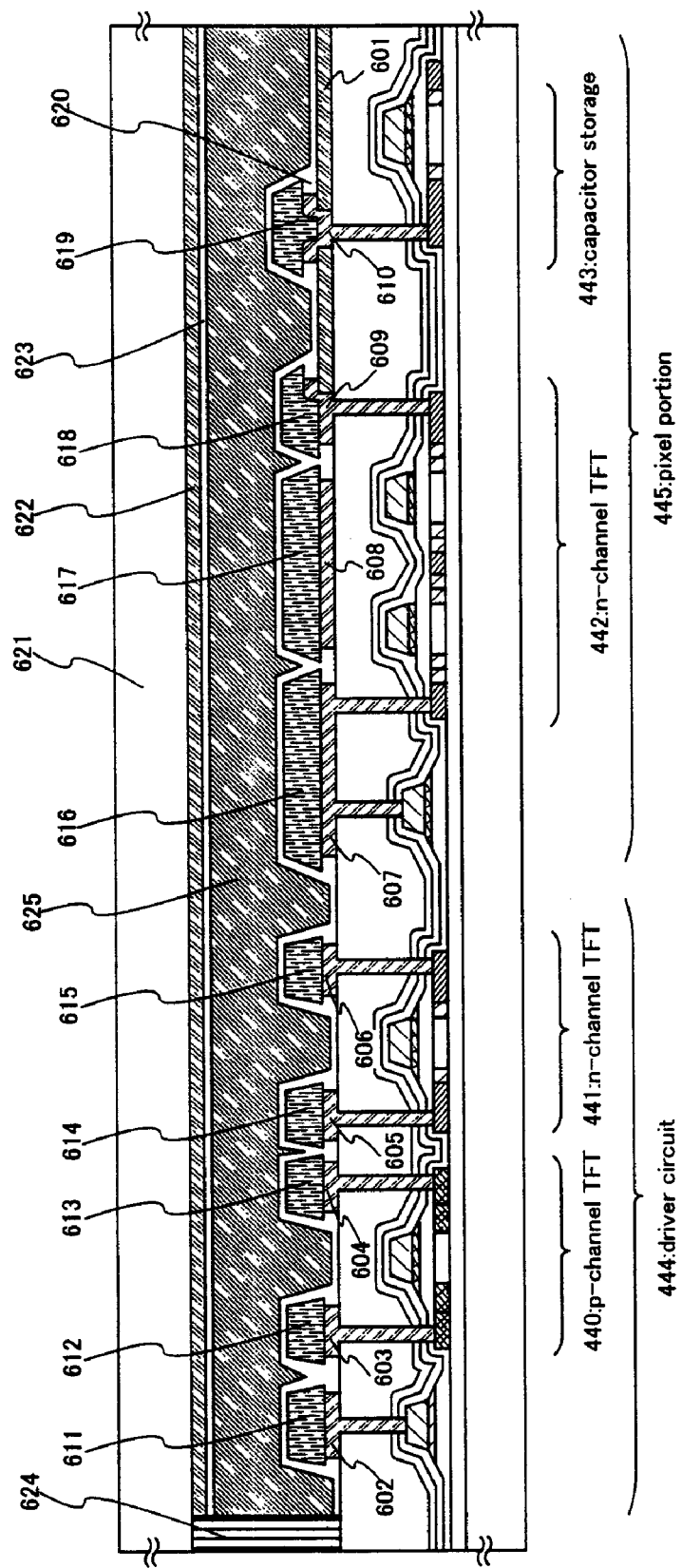
FIG. 15 is a sectional view illustrating the structure of a liquid crystal display device using a crystalline semiconductor film according to the present invention.

This embodiment gives an example of manufacturing an active matrix liquid crystal display device from the TFTs fabricated in Embodiment 7. In FIG. 15, a pixel electrode 601 is formed from a transparent conductive film on the interlayer insulating film of the pixel portion 445. The pixel electrode is connected to an auxiliary electrode 609 that is connected to the n-channel TFT 442 of the pixel portion. The pixel electrode is also connected to an auxiliary electrode 610 of the capacitor storage 443. These auxiliary electrodes, a gate line 608, a connection electrode 607, source or drain wiring lines 603 to 606 of the TFTs of the driver circuit 444, and a wiring line 602 are obtained by forming organic resin films 611 to 619 from photoresist, photosensitive polyimide, photosensitive acrylic or the like as masks and by etching the conductive films under the masks.

The organic resin films 611 to 619 are formed by applying an organic resin material to the entire surface of the conductive film for forming a wiring line and then patterned by light exposure process as shown in FIG. 15. Thereafter, a polyimide resin layer having a viscosity of 5 to 20 mPa is formed by offset printing, and is baked at 200° C. to form an oriented film. The polyimide resin applied by offset printing can reach into the stepped portions between the organic resin films 611 to 619 and the wiring lines or electrodes under the organic resin films during baking, and covers the ends thereof. Then the oriented film is subjected to rubbing to orient a liquid crystal.

An opposite substrate 621 has an opposite electrode 622 that is formed of a transparent conductive film, and has an oriented film 623. The opposite substrate 621 is bonded, using a sealing member 624, to a substrate on which the pixel portion 445 and the driver circuit 444 are formed. The sealing member 624 has a filler (not shown in the drawing) mixed therein. The filler, together with a spacer (not shown in the drawing), keeps the distance between the substrates uniform when the substrates are bonded to each other. Thereafter, a liquid crystal 625 is injected between the substrates. A known liquid crystal material can be used. For example, a thresholdless antiferroelectric liquid crystal mixture can be used as well as a TN liquid crystal. The thresholdless antiferroelectric liquid crystal mixture exhibits electro-optical responsiveness in which the transmittance changes continuously in relation to the electric field. Some of antiferroelectric liquid crystal mixtures exhibit an electro-optical response characteristic that forms a letter V when graphed. In this way, an active matrix liquid crystal display device shown in FIG. 15 is completed.

Embodiment 9

Figure 16:
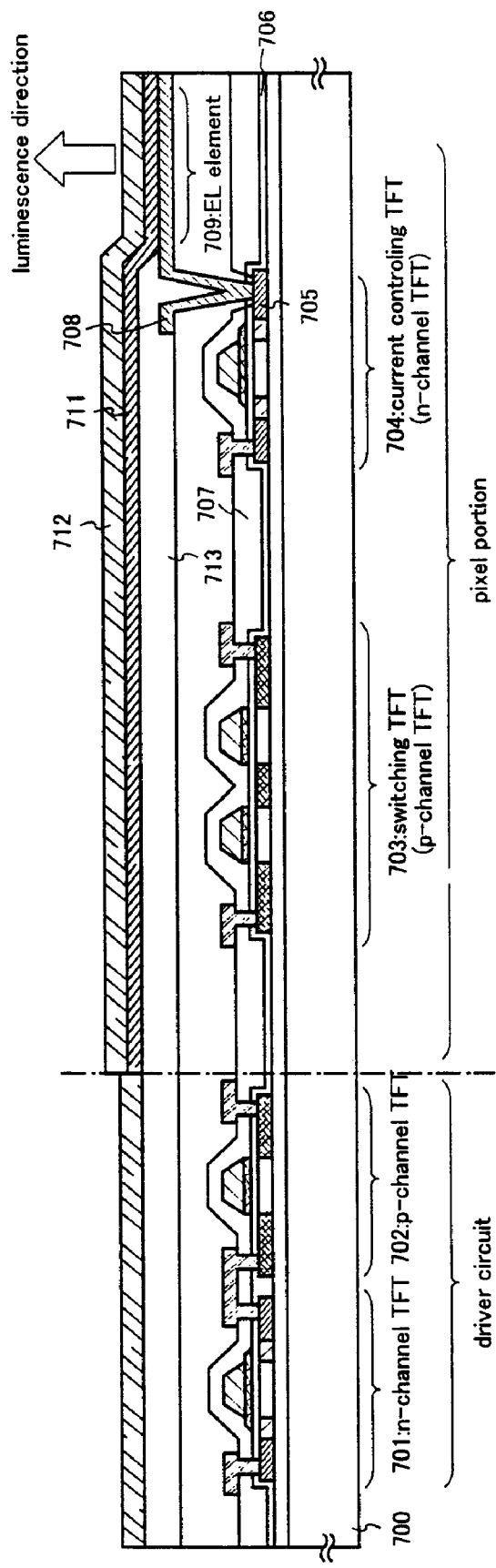
FIG. 16 is a sectional view illustrating the structure of an EL display device formed from a crystalline semiconductor film according to the present invention.

The description given below with reference to FIG. 16 is about an example of manufacturing a display device utilizing electroluminescence (EL) from TFTs fabricated in accordance with Embodiments 4 through 6. Here, EL refers to either fluorescence or phosphorescence.

FIG. 16 shows an example of a light emitting device in which a pixel portion and a driver circuit for driving the pixel portion are formed on the same insulator (the device shown is not sealed yet). In FIG. 16, a CMOS circuit that is the basic unit is shown as the driver circuit and the structure of TFTs necessary for only one pixel is shown as the pixel portion. This CMOS circuit is obtained in accordance with Embodiment 6.

In FIG. 16, a substrate 700 is an insulator. Formed on the substrate 700 are: an n-channel TFT 701; a p-channel TFT 702; a switching TFT 703 that is from a p-channel TFT; and a current controlling TFT 704 that is from an n-channel TFT. Channel formation regions of these TFTs are formed of a crystalline semiconductor film that is formed in accordance with the present invention. Specifics of the formation method are described in Embodiments 1 through 3. The current controlling TFT is required to have high current driving ability. When it is formed from the polycrystalline semiconductor film obtained by the present invention, the current controlling TFT can have high electric field effect mobility, and hence high current driving ability.

The n-channel TFT 701 and the p-channel TFT 702 are as described in Embodiment 6 and hence the explanations thereof are omitted here. The switching TFT 703 has a structure in which two channel formation regions are formed between a source region and a drain region (double gate structure). The TFT of this embodiment is not limited to the double gate structure but may take the single gate structure in which one channel formation region is formed or the triple gate structure in which three channel formation regions are formed.

A contact hole is formed in a first interlayer insulating film 706 on a drain region 705 of the current controlling TFT 704 before a second interlayer insulating film 70, is formed. This is to facilitate the etching process when a contact hole is formed in the second interlayer insulating film 707. The contact hole formed in the second interlayer insulating film 707 reaches the drain region 705, and a pixel electrode 708 connected to the drain region 705 is provided. The pixel electrode 708 is an electrode functioning as a cathode of an EL element, and is formed of a conductive film containing an element that belongs to Group 1 or 2 in the periodic table. In this embodiment, a conductive film of a compound of lithium and aluminum is used.

Denoted by 713 is an insulating film formed to cover the end of the pixel electrode 708, and the insulating film is called herein as a bank. The bank 713 may be an insulating film containing silicon or a resin film. When a resin film is used, carbon particles or metal particles are put in the resin film so that the resistivity of the resin film is changed to $1\times10^6$ to $1\times10^{12}$ Ωm (preferably $1\times10^8$ to $1\times10^{10}$ Ωm). This prevents dielectric breakdown upon film formation.

An EL element 709 is composed of the pixel electrode (cathode) 708, an EL layer 711 and an anode 712. The anode 712 is formed of a conductive film having a large work function, typically, an oxide conductive film. Examples of the usable oxide conductive film include an indium oxide film, a tin oxide film, a zinc oxide film, and a compound film of these oxides. The EL layer in this specification refers to a laminate obtained by combining a light emitting layer with a hole injection layer, a hole transportation layer, a hole blocking layer, an electron transportation layer, an electron injection layer, or an electron blocking layer.

Though not shown, it is effective to form a passivation film so as to cover the EL element 709 completely after the anode 712 is formed. For the passivation film, an insulating film such as a carbon film, a silicon nitride film, and a silicon oxynitride film is formed. The passivation film may be a single layer or laminate of these insulating films.

Embodiment 10

The metal element utilized in crystallization is remained in the crystalline silicon film formed in accordance with the method of Embodiment 1 or 2. This embodiment describes removing the metal element by a method different from the one shown in Embodiment 4. The removing method of this embodiment uses as a gettering site a semiconductor film containing a noble gas element or a semiconductor film doped with a noble gas element, and removes the metal element by heat treatment from the crystalline silicon film that has been formed through doping of the metal element. Hereinafter the description will be given with reference to FIGS. 25A to 25D.

Following Embodiment 1 or 2, a crystalline silicon film having high {101} plane orientation ratio will be formed first. A substrate 2500 having an insulating surface is prepared. On the substrate 2500, a base insulating film 2501 is formed from a laminate of a first silicon oxynitride film and a second silicon oxynitride film. The first silicon oxynitride film is formed to a thickness of 50 nm using as reaction gas $SiH_4$, $NH_3$ and $N_2O$ and the second silicon oxynitride film is formed to a thickness of 100 nm using as reaction gas $SiH_4$ and $N_2O$.

Figure 25A:
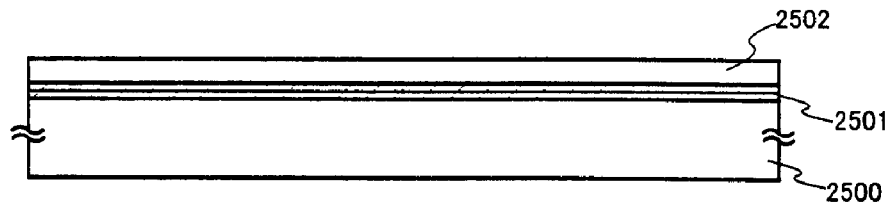
FIGS. 25A to 25D are diagrams illustrating a method of manufacturing a crystalline semiconductor film.
Figure 25B:
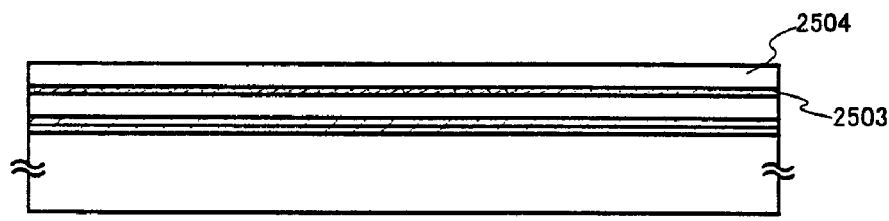

Subsequently, an amorphous semiconductor film is formed on the base insulating film 2501 and then crystallized to form a crystalline silicon film 2502 containing germanium in accordance with Embodiment 1 or 2. Since nickel tends to move toward a region having a high oxygen concentration when gettering is employed to remove nickel used for doping in crystallization, the crystalline silicon film 2502 containing germanium desirably has an oxygen concentration of $5\times10^{18}$ atoms/cm$^3$ or less (FIG. 25A).

After the crystallization, the segregated metal element may be removed or reduced by an etchant containing hydrofluoric acid, such as diluted hydrofluoric acid or FPM (a mixture of hydrofluoric acid, hydro peroxide, and pure water). When the surface is etched using an etchant containing hydrofluoric acid, treatment for leveling the surface by irradiating it with intense light from a lamp light source may be added.

Before gettering treatment, a barrier layer 2503 is formed on the crystalline silicon film containing germanium. Formed as the barrier layer 2503 is a porous film through which the metal element (here, mainly nickel) can move to a gettering site but an etchant for use in the step of removing the gettering site cannot permeate. Examples of the barrier layer material meeting the above condition include a chemical oxide film formed through treatment with ozone water, an oxide film oxidized by ozone generated through irradiation of ultraviolet rays in an atmosphere containing oxygen, and a silicon oxide film (SiOx) formed by sputtering or vacuum evaporation. The thickness of these insulating films is set to 1 to 5 nm. Because the barrier layer 2503 does not need to be thick, a naturally oxidized film can substitute for the barrier layer.

Next, a semiconductor film 2504 to function as the gettering site in the subsequent gettering treatment is formed on the barrier layer 2503. (FIG. 25B) The semiconductor film 2504 is a semiconductor film having an amorphous structure which is formed by plasma CVD, reduced pressure thermal CVD or preferably sputtering. The thickness of the semiconductor film 2504 is set to 50 to 200 nm, preferably 150 nm. Since nickel tends to move toward a region having a high oxygen concentration during the subsequent gettering treatment, the semiconductor film 2504 desirably has an oxygen concentration of $5\times10^{18}$ atoms/cm$^3$ or more, preferably $1\times10^{19}$ atoms/cm$^3$ or more (by SIMS) for improving the gettering efficiency. A semiconductor film containing a noble gas element in a concentration of $1\times10^{20}$ atoms/cm$^3$ may also be used.

The most desirable method of forming the semiconductor film is sputtering using silicon as a target and noble gas as sputtering gas. In sputtering, it is easy to mix the noble gas into the semiconductor film by lowering the pressure upon film formation. The semiconductor film thus formed can contain a noble gas element in a concentration of $1\times10^{20}$ to $2\times10^{21}$ atoms/cm$^3$, preferably $1\times10^{20}$ to $1\times10^{21}$ atoms/cm$^3$. The noble gas element is one or more elements selected from the group consisting of He, Ne, Ar, Kr and Xe. These ions are accelerated by electric field and implanted in the semiconductor film, so that dangling bonds and lattice distortion are formed to form the gettering site. Of those, Ar is inexpensive and therefore desirable.

In addition to the noble gas element, the semiconductor film may be doped with one or more elements selected from the group consisting of hydrogen, oxygen, boron, and phosphorus. Doping a plurality of elements provides a synergetic effect for gettering.

Then the gettering is conducted through heat treatment or irradiation of intense light from a lamp light source. If gettering is made by heat treatment, the film is heated in a nitrogen atmosphere at 450 to 800° C. for one to twenty-four hours, for example, at 500° C. for four hours. If the gettering is performed by irradiation of intense light from a lamp light source, the lamp light source for heating is lit for 120 to 300 seconds, preferably 180 seconds to raise the temperature up to 650 to 750° C.

Figure 25C:

Through the gettering, nickel moves in the direction indicated by the arrow in FIG. 25C (longitudinal direction) to remove the metal element in the crystalline silicon film 2502 containing germanium which is covered with the barrier layer 2503 or reduce the concentration of the metal element. Compared with the gettering that uses phosphorus, the gettering including doping of a noble gas element is very effective. Furthermore, the film can be doped with a high concentration of noble gas element. e.g., $1\times10^{20}$ to $5\times10^{21}$ atoms/cm$^3$, thereby making it possible to increase the dose of the metal element used for crystallization. By increasing the dose of the metal element used for crystallization, the time required for crystallization can further be cut short. If not changing the crystallization treatment time, the increase in dose of the metal element used for crystallization lowers the temperature required for crystallization. Moreover, generation of natural nuclei can be reduced and a crystalline semiconductor film of excellent quality can be formed by increasing the dose of the metal element used for crystallization.

After the gettering treatment, the gettering site 2504 made of semiconductor film is removed by selective etching. The film may be etched by dry etching that uses $ClF_3$ not using plasma, or by wet etching that uses an alkaline solution such as an aqueous solution containing hydrazine or tetraethyl ammonium hydroxide (chemical formula: $(CH_3)_4NOH$). At this point, the barrier layer 2503 functions as an etching stopper. Then the barrier layer 2503 is removed using hydrofluoric acid.

Figure 25D:
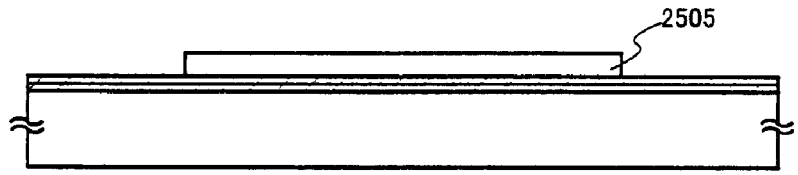

The obtained crystalline silicon film containing germanium is then etched to have a desired shape as shown in FIG. 25D. A semiconductor layer 2505 divided into island-like sections are thus formed. The semiconductor layer 2505 can be used to form the TFTs shown in Embodiments 4 through 6.

FIG. 26A shows results of measuring the concentration of the metal element (here, nickel) before and after the gettering treatment by total reflection X-ray fluorescence spectroscopy (TXRF). As shown in FIG. 26B. TXRF is a measurement method in which an X-ray beam enters the film at a very small angle with respect to the film surface to detect a fluorescent X-ray emitted from impurities such as a metal element. TXRF provides information about the state of the film 3 to 5 nm deep from the surface, which can be used to estimate the concentration of nickel remaining in the crystalline silicon film. The detection sensibility is approximately $10^{10}$ atoms/cm$^2$.

In FIG. 26A, the axis of ordinates shows the concentration of nickel. A sample that does not receive the gettering treatment has remaining nickel of $5 \times 10^{12}$ (arbitrary unit) whereas samples that receive the gettering treatment have a smaller amount of nickel. Thus the graph shows that the nickel concentration in the crystalline semiconductor film is reduced by the gettering treatment to 1/100. Compared with the heat treatment temperature for the gettering treatment, heat treatment at 500° C. can reduce nickel more than the heat treatment at 450° C.

The crystalline silicon film containing germanium in accordance with this embodiment is high in {101} plane orientation ratio and sufficiently low in concentration of the metal element within the film. Therefore, when used in a TFT, the crystalline silicon film can provide the TFT with reduced OFF current characteristics.

Embodiment 11

The semiconductor device of the present invention can be applied to the circuits to substitute for the display devices and integrated circuits of a variety of electronic devices and to substitute for the conventional integrated circuits. Such semiconductor devices include portable data terminals (electronic notebook, mobile computer, cell phone, etc.), video camera, still camera, personal computer, TV and projector. Their examples are shown in FIGS. 22A to 24D.

Figure 22A:
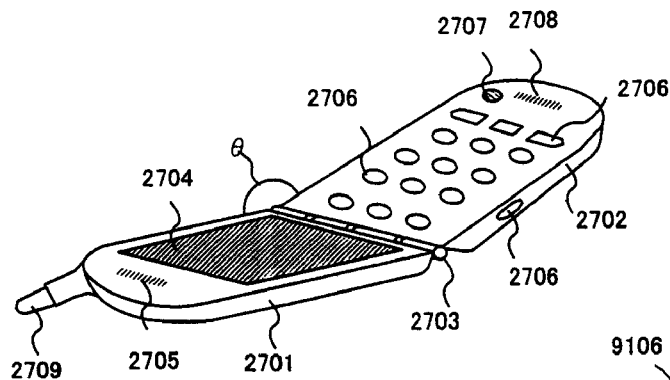
FIGS. 22A to 22E are diagrams showing examples of semiconductor device.

FIG. 22A shows a cell phone which comprises a display panel 2701, an operation panel 2702 and a connection portion 2703, the display panel 2701 including a display device 2704 typified by a liquid crystal display device or an EL display device, a voice output unit 2705 and an antenna 2709. The operation panel 2702 includes operation keys 2706, a power source switch 2707, a voice input unit 2708, and so on. This invention forms the display device 2704 and the semiconductor integrated circuit which accompanies it.

Figure 22B:
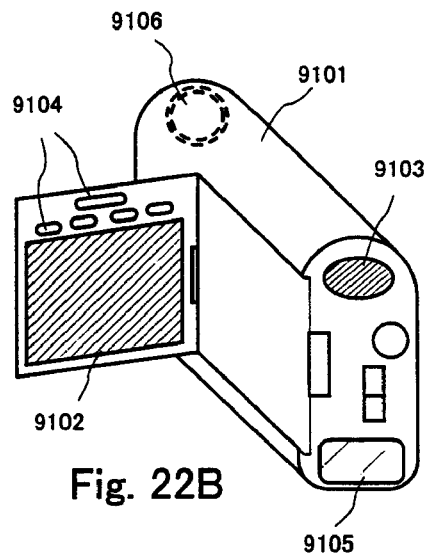

FIG. 22B shows a video camera which comprises a main body 9101, a display device 9102 typified by a liquid crystal display device or an EL display device, a voice input unit 9103, operation switches 9104, a battery 9105 and an image receiving unit 9106. The invention can be applied to the display device 9102 and the semiconductor integrated circuit which accompanies it.

Figure 22C:
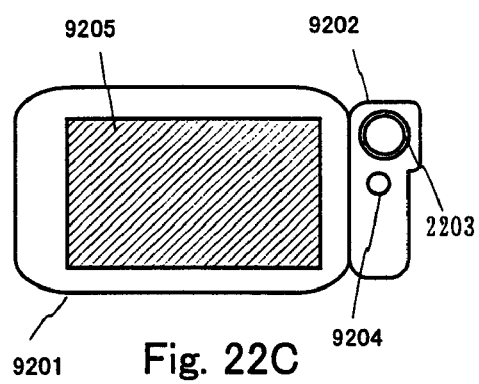

FIG. 22C shows a mobile computer or a portable data terminal which is constituted by a main body 9201, a camera unit 9202, a picture unit 9203, operation switches 9204 and a display device 9205 typified by a liquid crystal display device or an EL display device. The semiconductor device of this invention can be applied to the display device 9205 and the semiconductor integrated circuit which accompanies it.

Figure 22D:
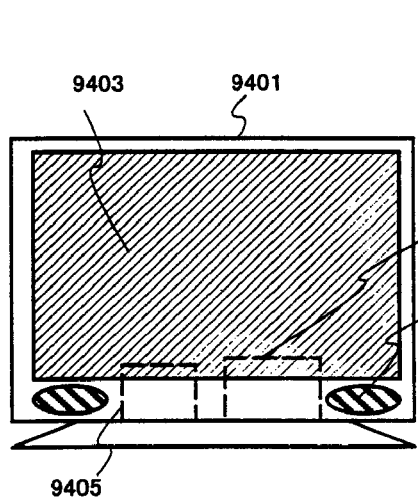

FIG. 22D shows a TV receiver constituted by a main body 9401, a speaker 9402, a display device 9403 typified by a liquid crystal display device or an EL display device, a receiver unit 9404 and an amplifier unit 9405. The invention can be applied to the display device 9403 and the semiconductor integrated circuit which accompanies it.

Figure 22E:
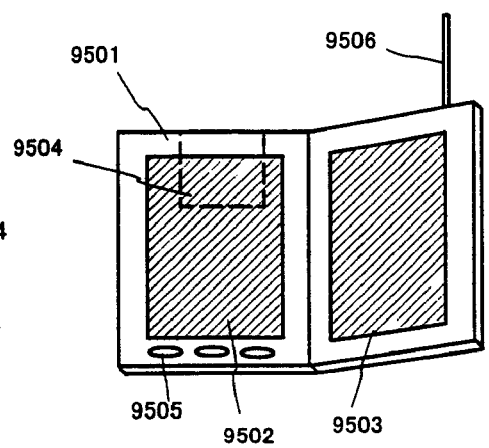

FIG. 22E shows a portable notebook constituted by a main body 9501, display devices 9502, 9503 typified by a liquid crystal display device or an EL display device, a storage medium 9504, operation switches 9505 and an antenna 9506, which is used for displaying data stored in a mini-disk (MD) or in a DVD and for displaying data received by the antenna. The invention can be applied to the display devices 9502, 9503 and to the storage medium 9504 and the semiconductor integrated circuit which accompanies it.

Figure 23A:
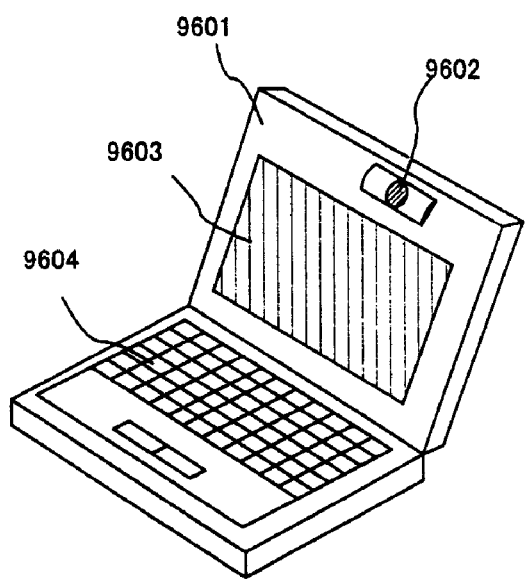
FIGS. 23A to 23C are diagrams showing examples of semiconductor device.

FIG. 23A shows a personal computer constituted by a main body 9601, an image input unit 9602, a display device 9603 typified by a liquid crystal display device or an EL display device and a keyboard 9604. The invention can be applied to the display device 9603 and to various integrated circuits contained therein.

Figure 23B:
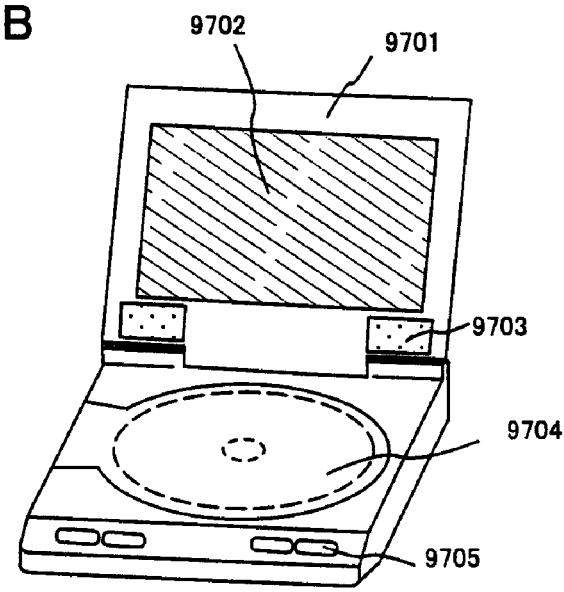

FIG. 23B shows a player using a recording medium recording a program (hereinafter referred to as recording medium), which is constituted by a main body 9701, a display device 9702 typified by a liquid crystal display device or an EL display device, a speaker unit 9703, a recording medium 9704 and operation switches 9705. This device uses a DVD (digital versatile disc) or a CD as a recording medium, with which the user can enjoy appreciating music, movies, or playing games or Internet. The invention can be applied to the display device 9702 and to various integrated circuits contained therein.

Figure 23C:
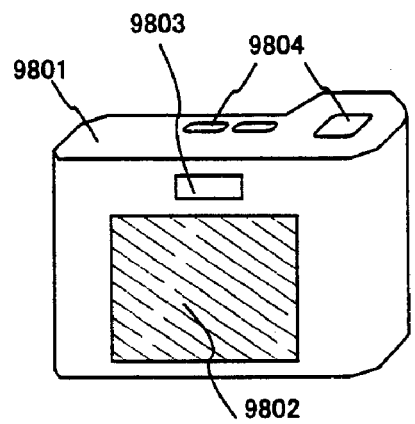

FIG. 23C shows a digital camera constituted by a main body 9801, a display device 9802 typified by a liquid crystal display device or an EL display device, an eyepiece unit 9803, operation switches 9804 and an image receiving unit (not shown). The invention can be applied to the display device 9802 and to various integrated circuits contained therein.

Figure 24A:
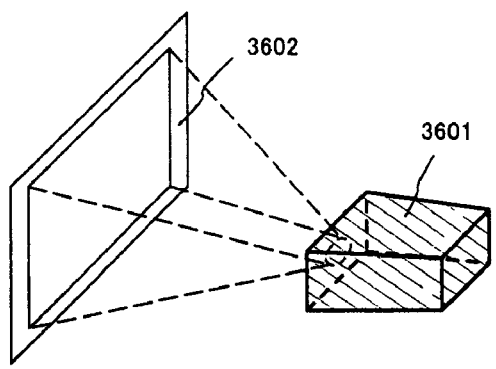
FIGS. 24A to 24D are diagrams showing examples of projector.

FIG. 24A shows a front-type projector constituted by a projector 3601 and a screen 3602. The invention can be applied to the projector 3601 and to other signal control circuits.

Figure 24B:
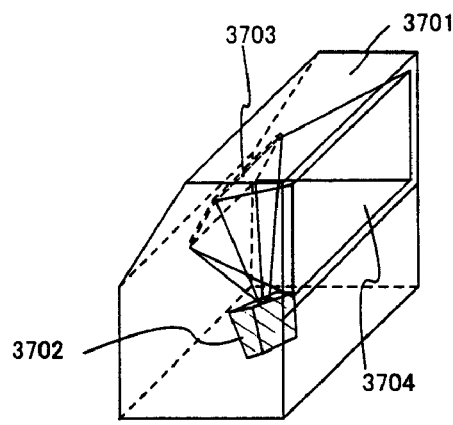

FIG. 24B shows a rear-type projector constituted by a main body 3701, a projector 3702, a mirror 3703 and a screen 3704. The invention can be applied to the projector 3702 and other signal control circuits.

Figure 24C:
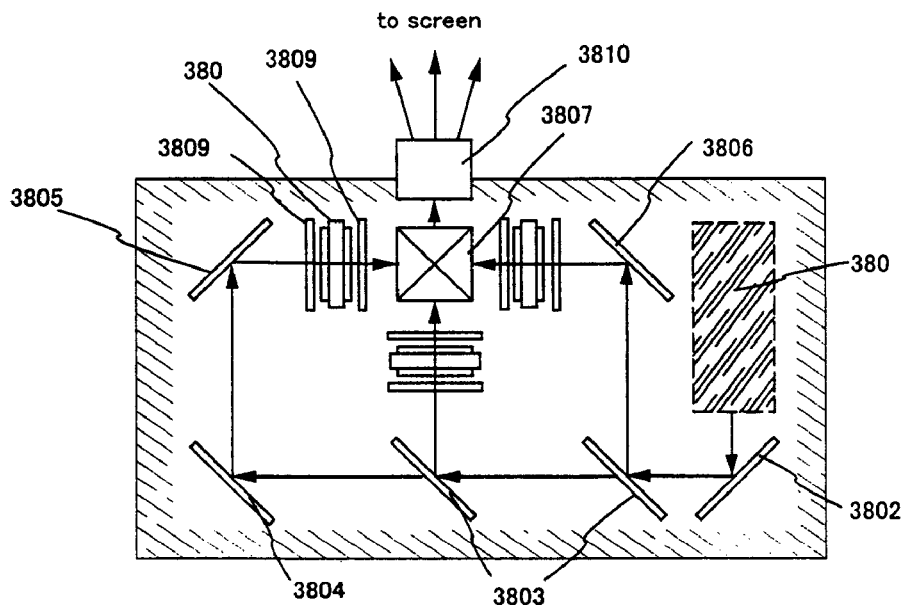

FIG. 24C is a diagram illustrating an example of structures of the projectors 3601 and 3702 in FIGS. 24A and 24B. The projectors 3601, 3702 are constituted by an optical system 3801 of a source of light, mirrors 3802, 3804 to 3806, a dichroic mirror 3803, a prism 3807, a liquid crystal display device 3808, a phase difference plate 3809 and a projection optical system 3810. The projection optical system 3810 is constituted by an optical system inclusive of a projection lens. Though this embodiment shows an example of the three-plate type, there may be employed the one of the single-plate type without being limited thereto. In the optical paths indicated by arrows in FIG. 24C, further, the user may suitably provide an optical system such as an optical lens, a film having a polarizing function, a film for adjusting the phase difference or an IR film.

Figure 24D:
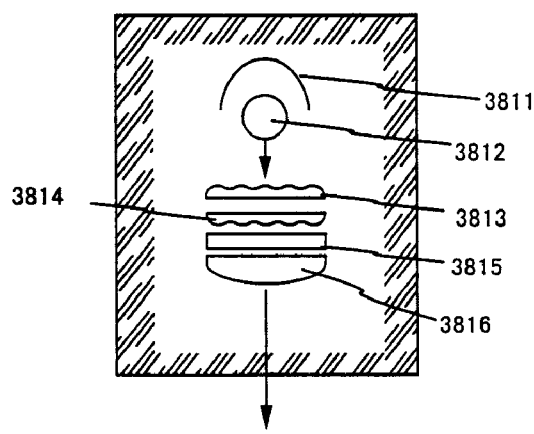

FIG. 24D is a diagram illustrating an example of the structure of the optical system 3801 of the source of light in FIG. 24C. In this embodiment, the optical system 3801 of the source of light is constituted by a reflector 3811, a source of light 3812, lens arrays 3813, 3814, a polarizer/converter element 3815 and a focusing lens 3816. The optical system of the source of light shown in FIG. 24D is only an example, and is not particularly limited thereto only. For example, the user may suitably provide the optical system of the source of light with an optical system such as an optical lens, a film having a polarizing function, a film for adjusting the phase difference or an IR film.

Though not diagramed, the invention can be further applied as a display device to navigation systems as well as to refrigerators, washing machines, microwave ovens, fixed telephones and display device integrated facsimile. Thus, the invention has a very wide range of applications and can be applied to a variety of products.

A polycrystalline semiconductor film having 50% or higher {101} plane orientation ratio is obtained by forming an amorphous semiconductor film containing germanium by plasma CVD that employs intermittent electric discharge or pulsed electric discharge, and subjecting the amorphous semiconductor film to heat treatment for crystallization after the amorphous semiconductor film is doped with an element for promoting crystallization of the film.

The polycrystalline semiconductor film as this can be used to form an active region of a semiconductor device. The film is especially suitable for a channel formation region of a thin film transistor. A TFT formed from this crystalline semiconductor film can be used as a TFT for manufacturing an active matrix liquid crystal display device or EL display device, or as a TFT constituting a thin film integrated circuit that is to replace the conventional LSI formed on a semiconductor substrate.

What is claimed is:

1. A method of manufacturing a semiconductor device, comprising:
   forming an amorphous semiconductor film, the amorphous semiconductor film containing germanium with a composition ratio to silicon greater than or equal to 0.1 atomic percent and less than or equal to 10 atomic percent;
   irradiating the semiconductor film with a second harmonic of a laser to increase crystallinity of the semiconductor film wherein a wavelength said second harmonic is 532 nm; and
   patterning the semiconductor film after irradiation of said second harmonic of the laser to form a semiconductor island which includes a channel formation region, wherein a ratio of {101} planes in the semiconductor film is 30% or more of all the lattice planes detected by Electron backscatter diffraction.

2. The method according to claim 1 wherein the laser is a YAG laser.

3. The method according to claim 1 wherein the laser is a $YVO_4$ laser.

4. The method according to claim 1 wherein the semiconductor film contains nitrogen at a concentration less than $5 \times 10^{18}$ atoms/cm$^3$.

5. The method according to claim 1 wherein the semiconductor film contains carbon at a concentration less than $5 \times 10^{18}$ atoms/cm$^3$.

6. The method according to claim 1 wherein the semiconductor film contains oxygen at a concentration less than $1 \times 10^{19}$ atoms/cm$^3$.

7. A method of manufacturing a semiconductor device, comprising:
   forming an amorphous semiconductor film, the amorphous semiconductor film containing germanium with a composition ratio to silicon greater than or equal to 0.1 atomic percent and less than or equal to 10 atomic percent wherein said amorphous semiconductor film is formed by plasma CVD through intermittent electric discharge;
   irradiating the semiconductor film with a second harmonic of a laser to increase crystallinity of the semiconductor film wherein a wavelength said second harmonic is 532 nm; and
   patterning the semiconductor film after irradiation of said second harmonic of the laser to form a semiconductor island which includes a channel formation region.

8. The method according to claim 7 wherein the laser is a YAG laser.

9. The method according to claim 7 wherein the laser is a $YVO_4$ laser.

10. The method according to claim 7 wherein the semiconductor film contains nitrogen at a concentration less than $5 \times 10^{18}$ atoms/cm$^3$.

11. The method according to claim 7 wherein the semiconductor film contains carbon at a concentration less than $5 \times 10^{18}$ atoms/cm$^3$.

12. The method according to claim 7 wherein the semiconductor film contains oxygen at a concentration less than $5 \times 10^{19}$ atoms/cm$^3$.

13. The method according to claim 7, wherein said intermittent electric discharge has a repetition frequency of 10 kHZ or below and a duty ratio of 50% or less.

14. A method of manufacturing a semiconductor device, comprising:
   forming an amorphous semiconductor film, the amorphous semiconductor film containing germanium with a composition ratio to silicon greater than or equal to 0.1 atomic percent and less than or equal to 10 atomic percent wherein said amorphous semiconductor film is formed by plasma CVD through intermittent electric discharge;
   irradiating the semiconductor film with a second harmonic of a laser to increase crystallinity of the semiconductor film wherein a wavelength said second harmonic is 532 nm; and
   patterning the semiconductor film after irradiation of said second harmonic of the laser to form a semiconductor island which includes a channel formation region, wherein a ratio of {101} planes in the semiconductor film is 30% or more of all the lattice planes detected by Electron backscatter diffraction.

15. The method according to claim 14 wherein the laser is a YAG laser.

16. The method according to claim 14 wherein the laser is a $YVO_4$ laser.

17. The method according to claim 14 wherein the semiconductor film contains nitrogen at a concentration less than $5\times10^{18}$ atoms/cm$^3$.

18. The method according to claim 14 wherein the semiconductor film contains carbon at a concentration less than $5\times10^{18}$ atoms/cm$^3$.

19. The method according to claim 14 wherein the semiconductor film contains oxygen at a concentration less than $5\times10^{19}$ atoms/cm$^3$.

20. The method according to claim 14, wherein said intermittent electric discharge has a repetition frequency of 10 kHZ or below and a duty ratio of 50% or less.

21. A method of manufacturing a semiconductor device, comprising:

forming an amorphous semiconductor film, the amorphous semiconductor film containing germanium with a composition ratio to silicon greater than or equal to 0.1 atomic percent and less than or equal to 10 atomic percent; p1 heating the amorphous semiconductor film to crystallize said amorphous semiconductor film;

irradiating the semiconductor film with a second harmonic of a laser to increase crystalliity of the semiconductor film wherein a wavelength said second harmonic is 532 nm; and patterning the semiconductor film after irradiation of said second harmonic of the laser to form a semiconductor island which includes a channel formation region, wherein a ratio of {101} planes in the semiconductor film is 30% or more of all the lattice planes detected by Electron backscatter diffraction.

22. The method according to claim 21 further comprising a step of providing said amorphous semiconductor film with an element for promoting crystallization of the amorphous semiconductor film.

23. A method of manufacturing a semiconductor device, comprising:

forming an amorphous semiconductor film, the amorphous semiconductor film containing germanium with a composition ratio to silicon greater than or equal to 0.1 atomic percent and less than or equal to 10 atomic percent wherein said amorphous semiconductor film is formed by plasma CVD through intermittent electric discharge;

heating the amorphous semiconductor film to crystallize said amorphous semiconductor film;

irradiating the semiconductor film with a second harmonic of a laser to increase crystallinity of the semiconductor film wherein a wavelength said second harmonic is 532 nm; and patterning the semiconductor film after irradiation of said second harmonic of the laser to form a semiconductor island which includes a channel formation region.

24. The method according to claim 23 further comprising a step of providing said amorphous semiconductor film with an element for promoting crystallization of the amorphous semiconductor film.

* * * * *